(12) United States Patent
Zhang

(10) Patent No.: US 7,696,102 B2
(45) Date of Patent: Apr. 13, 2010

(54) METHODS FOR FABRICATION OF THREE-DIMENSIONAL STRUCTURES

(76) Inventor: Gang Zhang, 1801 Crest Vista Dr., #1A, Monterey Park, CA (US) 91754

( * ) Notice: Subject to any disclaimer, the term of this patent is extended or adjusted under 35 U.S.C. 154(b) by 559 days.

(21) Appl. No.: 11/278,137

(22) Filed: Mar. 30, 2006

(65) Prior Publication Data

US 2009/0250430 A1 Oct. 8, 2009

Related U.S. Application Data

(60) Provisional application No. 60/666,990, filed on Mar. 31, 2005.

(51) Int. Cl.
*H01L 21/461* (2006.01)
(52) U.S. Cl. .................. 438/738; 438/751
(58) Field of Classification Search .............. None
See application file for complete search history.

(56) References Cited

U.S. PATENT DOCUMENTS

| | | | |
|---|---|---|---|
| 5,190,637 A | 3/1993 | Guckel | |
| 5,820,771 A | 10/1998 | Burke et al. | |
| 5,846,638 A * | 12/1998 | Meissner | 428/220 |
| 5,955,818 A | 9/1999 | Bertin et al. | |
| 6,027,630 A | 2/2000 | Cohen | |
| 6,332,568 B1 | 12/2001 | Christenson | |
| 6,475,369 B1 | 11/2002 | Cohen | |
| 6,572,742 B1 | 6/2003 | Cohen | |
| 6,607,934 B2 | 8/2003 | Chang et al. | |
| 6,790,377 B1 | 9/2004 | Cohen | |
| 7,091,604 B2 | 8/2006 | Wylie et al. | |
| 7,235,166 B2 * | 6/2007 | Cohen et al. | 205/118 |
| 7,332,410 B2 | 2/2008 | Tong | |
| 7,494,557 B1 | 2/2009 | Peterson | |
| 2002/0164111 A1 | 11/2002 | Mirza | |
| 2004/0000489 A1 * | 1/2004 | Zhang et al. | 205/118 |
| 2004/0007470 A1 | 1/2004 | Smalley | |
| 2005/0023145 A1 | 2/2005 | Cohen et al. | |

(Continued)

OTHER PUBLICATIONS

Cohen, et al., "EFAB: Rapid, Low-Cost Desktop Micromachining of High Aspect Ratio True 3-D MEMS," Proceedings of 12th IEEE Micro Electro Mechanical Systems Workshop 1999, Orlando, Florida, pp. 244-251 (1999).

(Continued)

*Primary Examiner*—Alonzo Chambliss

(57) ABSTRACT

A multi-layer fabrication method for making three-dimensional structures is provided. In one embodiment, the formation of a multi-layer three-dimensional structure comprises: 1) fabricating a plurality of layers with each layer comprising at least two materials; 2) aligning the layers; 3) attaching the layers together to form a multi-layer structure; and 4) removing at least a portion of at least one of the materials from the multi-layer structure. Fabrication methods for making the required layers are also disclosed. In another embodiment, the formation of a multi-layer three-dimensional structure comprises: 1) attaching a layer of a material to a substrate or a previously formed layer; 2) machining the attached layer to form a layer that comprises at least two materials; and 3) repeating the operations of 1) and 2) a plurality of times to form a multi-layer structure; and 4) removing at least a portion of at least one of the materials from the multi-layer structure to form a desired three-dimensional structure.

28 Claims, 14 Drawing Sheets

U.S. PATENT DOCUMENTS

2007/0089993 A1    4/2007    Schwartz et al.

OTHER PUBLICATIONS

Christenson, et al., "A Batch Wafer Scale LIGA Assembly and Packaging Technique via Diffusion Bonding," Proceedings of 12th IEEE Micro Electro Mechanical Systems Workshop 1999, Orlando, Florida, pp. 476-481 (1999).

Zhang, "Electrochemical microfabrication for high-aspect ratio 3-D microstructures," Proceedings of SUR/FIN 2005, St. Louis, Missouri, pp. 412-431 (2005).

* cited by examiner

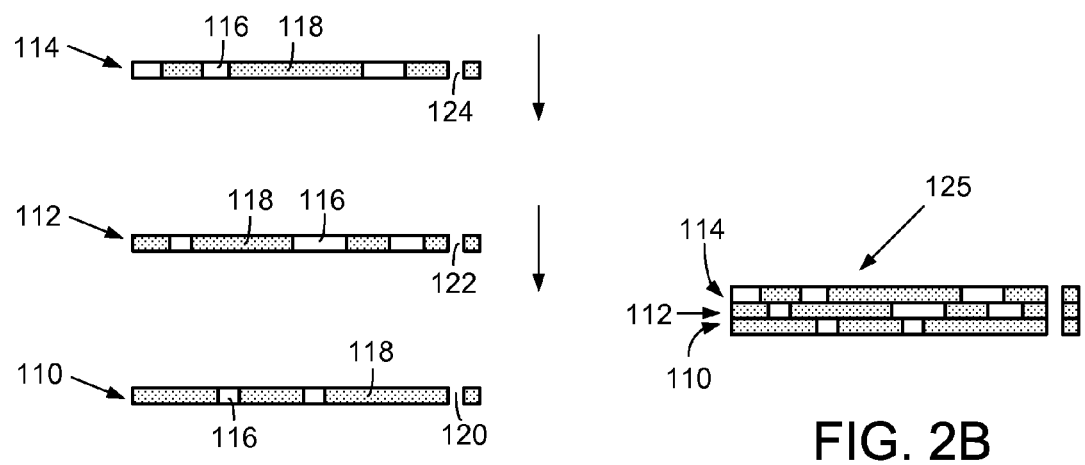
FIG. 2A
FIG. 2B
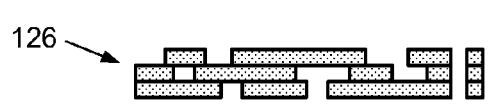
FIG. 2C1
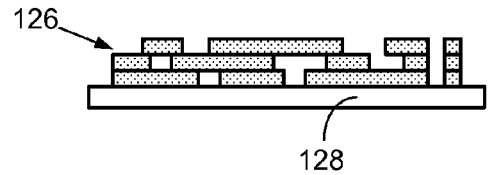
FIG. 2C2
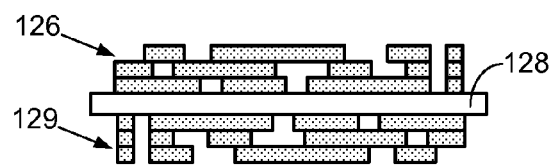
FIG. 2C3

METHODS FOR FABRICATION OF THREE-DIMENSIONAL STRUCTURES

CROSS-REFERENCE TO RELATED APPLICATIONS

This application claims the benefit of provisional patent application Ser. No. 60/666,990, filed Mar. 31, 2005 by the present inventor.

FIELD OF THE INVENTION

This invention generally relates to forming three-dimensional (3-D) structures. More particularly, it relates to fabrication processes for fabricating three-dimensional structures comprising micro-scale or meso-scale features.

BACKGROUND OF THE INVENTION

Multi-layer fabrication techniques are so far the most promising and versatile methods for fabricating truly three-dimensional microstructures with high-aspect-ratios for microelectromechanical systems (MEMS). U.S. Pat. No. 5,190,637, issued on Mar. 2, 1993 to Henry Guckel, and U.S. Pat. No. 6,027,630, issued on Feb. 22, 2000 to Adam L. Cohen, teach two fabrication methods for forming three-dimensional metal microstructures by using multi-layer electrochemical deposition. The only difference between the two methods is the way to perform the selective electrochemical deposition of metals. The essential elements of these two methods are described as follows.

(1) Three-dimensional microstructures are fabricated by using a successive layer-by-layer approach, meaning that a given layer can only be built after the pervious layer is completed.

(2) Each layer contains at least two different materials. In the case of a two-material system, one is a sacrificial material and the other is a structural material.

(3) Both structural material and sacrificial material are fabricated by using electrochemical deposition methods such as electrodeposition.

(4) After the deposition of both materials for building a given layer, a planarization process is used to machine the deposited materials to a predetermined thickness and to a flat and smooth surface as a base for building a next layer on it.

(5) After all layers have been built, the sacrificial material is etched to form a three-dimensional microstructure.

Although the above two multilayer electrochemical fabrication methods are practical for building truly three-dimensional microstructures, there are at least five (5) major drawbacks inherently associated with them, which are:

(1) Low throughput. Production throughput becomes an issue as the number of layers in the microdevices increases. This is because the multilayer approach is a successive process. A given layer can only be built after the pervious layer is completed. The two main risks associated with a successive process are: 1) When one layer meets fabrication problems, the fabrication process flow for this build has to be suspended until the problems are solved; and 2) If a build has to be discarded due to various reasons during fabrication, all previously fabricated layers have to be wasted.

(2) Low yield. In reality, each layer inevitably contains some defects. These defects may distribute at different locations on each layer. Therefore, the final yield of acceptable structures is an issue.

(3) Limited material selection. Electrochemical deposition can only be used to fabricate metals and alloys. It can not or can not easily make many important engineering and semiconductor materials such as stainless steel, aluminum and its alloys, titanium and its alloys, silicon, and non-metal materials. Further, although electrodeposition can be used to make many metals and alloys, only a small portion of them can be made practically and economically for mass production. Even among the metals and alloys that can be readily electrodeposited, there are those whose material properties are not as desired as those of the corresponding bulk materials. Therefore the electrochemical fabrication methods taught in the two patents have limited applications.

(4) Layer thickness limitation. The maximum metal layer thickness is restricted by the mask thickness (e.g., photoresist). The ability to select the layer thickness freely is crucial to the multilayer approach. For example, in some cases, several successive thin layers may have to be deposited to reach a required thickness if a single thick layer cannot be formed. Obviously, this would increase production time, decrease production throughput and lower product yield.

(5) Geometry limitation. The multi-layer electrochemical fabrication methods can manufacture complex three-dimensional metal microstructures. However, there exist some types of shapes which can not be fabricated. This geometry limitation is related to the etching of sacrificial material. If sacrificial material can not be removed (e.g., in a sealed cavity with no etching access paths) or can not be removed easily (e.g., in a long, narrow channel), microstructures with these shapes can not be made with the two methods.

U.S. Pat. No. 6,332,568 to Todd R. Christenson issued on Dec. 25, 2001 teaches a method to make three-dimensional microstructures via diffusion bonding of subassemblies to form a united structure. This method allows the parallel manufacture of a series of subassemblies which compose a microstructure or micromachine. Each subassembly is built on a separate substrate. Then according to a predetermined configuration of the microstructure, the second subassembly is diffusion bonded onto the first subassembly. The substrate of the second subassembly is separated from the bonded two subassemblies after diffusion bonding. Therefore the substrate of a subassembly can be viewed as a sacrificial material as the substrate needs to be removed after one bonding operation is done. The above two steps (diffusion bonding and separation) are repeated until the all subassemblies are bonded to form a united structure. Compared with the multi-layer electrochemical fabrication approaches, the advantage of Christenson's approach is that all the required subassemblies for a microstructure can be built separately. However, the bonding of the subassemblies is still a successive process, meaning that the previous subassembly must be bonded before a given subassembly can be bonded. Diffusion bonding involves heat and pressure. Assume that a microstructure comprises ten subassemblies. Only the last ($10^{th}$) subassembly undergoes heat and pressure treatment one time. All other nine subassemblies undergo heat and pressure treatment at least two times. The first two ($1^{st}$ and $2^{nd}$) subassemblies even undergo heat and pressure treatment nine times. The heat and pressure treatment may change the material properties of a microstructure or may distort the components of a microstructure. Therefore, practically this bonding method can only work for the very limited number of subassemblies although in theory there is no limit on the number of subassemblies that can be joined.

In addition, as each of two subassemblies to be bonded contains a substrate which increases the difficulty for the alignment of micro-components on the two substrates before bonding. The reason that Christenson's approach has to use a substrate as part of a subassembly is that the substrate works as a mechanical support for micro-components on it. Without this substrate, all components on the substrate will fall apart. It is very difficult to align two subassembly with their substrates as micro-components are located between two substrates during alignment. The micro-components on the two substrates could be damaged due to this difficult alignment as the components are not protected and can not be protected. After two subassemblies are bonded together, an extra process step has to be operated to separate one of the substrates, which not only increases process time and cost, but also may damage the bonded micro-components.

SUMMARY OF THE INVENTION

In a first aspect of the invention, a method for making a multi-layer three-dimensional structure comprises: 1) fabricating a plurality of layers with each layer comprising at least two materials; 2) aligning the layers; 3) attaching the layers together to form a multi-layer structure; and 4) removing at least a portion of at least one material from the multi-layer structure.

In a second aspect of the invention, a method for making a multi-layer three-dimensional structure comprises: 1) fabricating a plurality of layers with each layer comprising at least two materials; 2) aligning the layers; 3) attaching the layers together to form a multi-layer structure; 4) attaching the formed multi-layer structure to a substrate as desired; and 5) removing at least a portion of at least one material from the multi-layer structure.

In a third aspect of the invention, a method for making a multi-layer three-dimensional structure comprises: 1) fabricating a plurality of layers with each layer comprising at least two materials; 2) aligning the layers; 3) attaching the layers and a substrate together as desired to form a multi-layer structure; and 4) removing at least a portion of at least one material from the multi-layer structure.

In a fourth aspect of the invention, a method for making a multi-layer three-dimensional structure comprises: 1) fabricating a plurality of layers with each layer comprising at least two materials; 2) aligning the layers; 3) attaching the layers together to form a multi-layer structure; 4) removing at least a portion of at least one material from the multi-layer structure to form a new multi-layer structure; and 5) attaching the new multi-layer structure to a substrate as desired.

In a fifth aspect of the invention, a method for making a multi-layer three-dimensional structure comprises: 1) attaching a layer of a material to a substrate or a previously formed layer; 2) machining the attached layer to form a layer that comprises at least two materials; and 3) repeating the operations of 1) and 2) a plurality of times to form a multi-layer structure; and 4) removing at least a portion of at least one material from the multi-layer structure.

In a sixth aspect of the invention, a method for making a single layer as a building block of a multi-layer three-dimensional structure comprises: 1) attaching a layer of a material to a substrate; 2) selectively etching the attached layer to form one or more desired openings; 3) filling at least an additional material into at least one of the openings to form a composite layer; and 4) separating the formed composite layer from the substrate.

In a seventh aspect of the invention, a method for making a single layer as a building block of a multi-layer three-dimensional structure comprises: 1) forming a layer of a material onto a substrate; 2) selectively etching the formed material to form one or more desired openings; 3) filling at least an additional material into at least one of the openings to form a composite layer; and 4) separating the formed composite layer from the substrate.

In a eighth aspect of the invention, a method for making a single layer as a building block of a multi-layer three-dimensional structure comprises: 1) selectively forming at least a material onto at least one desired region of a substrate; 2) forming at least an additional material over the material(s) formed in the first step and the regions of the substrate that are not covered by the material(s) formed in the first step to form a composite layer; 3) planarizing the composite layer; and 4) separating the composite layer from the substrate.

In a ninth aspect of the invention, a method for making a group of layers as a building block of a multi-layer three-dimensional structure comprises: 1) attaching a layer of a material onto a substrate or onto a previously formed layer; 2) selectively etching the attached layer to form one or more desired openings; 3) filling at least an additional material into at least one of the openings to form a composite layer; 4) repeating the operations of 1), 2) and 3) a plurality of times to form a group of layers comprising a plurality of attached layers; and 5) separating the formed group of layers from the substrate.

In a tenth aspect of the invention, a method for making a group of layers as a building block of a multi-layer three-dimensional structure comprises: 1) forming a plurality of single layers with each layer comprising at least two materials; 2) aligning the single layers; and 3) attaching the single layers together to form a group of layers comprising a plurality of attached layers.

In a eleventh aspect of the invention, an additional post treatment step is operated after a multi-layer three-dimensional structure is formed so that the performance of the multi-layer three-dimensional structure can be enhanced after post treatment.

Further aspects of the invention will be apparent by those of skill in the art from the detailed description provided hereinafter and from the claims.

The present invention has at least the following advantages, which are:

(1) to provide a multi-layer fabrication method for the manufacture of truly three-dimensional structures comprising micro-scale or meso-scale features;

(2) to provide a multi-layer fabrication method which can manufacture three-dimensional structures by using a parallel approach instead of using the successive approaches so that production throughput will be greatly increased;

(2) to provide a multi-layer fabrication method which can greatly increase the yield of final acceptable structures;

(3) to provide a multi-layer fabrication method which can allow to use a broader range of materials as structure materials including the materials that can not be made or can not be made easily by using electrochemical deposition (e.g., stainless steel, titanium and its alloy, silicon and even non-metal materials, etc.);

(4) to provide a multi-layer fabrication method which can allow to use a broader range of layer thicknesses;

(5) to provide a multi-layer fabrication method which can make three-dimensional structures with the features such as sealed cavities and long narrow channels which can not be made or made easily with the multi-layer electrochemical fabrication methods;

(6) to provide a multi-layer fabrication method which can make three-dimensional structures on both sides of a substrate;

(7) to provide a multi-layer fabrication method which does not require the surfaces of materials on each side of a layer having a common level;

(8) to provide a multi-layer fabrication method which may use layers comprising openings; and (9) to provide a multi-layer fabrication method which can make three-dimensional microstructures comprising really unlimited layers.

Further advantages are to provide methods for making individual single layers and individual groups of layers which are used for forming multi-layer three-dimensional structures, to provide proper post treatments to built three-dimensional structures for protecting them and/or enhancing their properties, and to provide methods for making truly three-dimensional silicon structures and stainless steel structures. Still further advantages will become apparent form a consideration of the ensuing description, drawings, and claims.

BRIEF DESCRIPTION OF THE DRAWINGS

The features of the invention will be better understood by reference to the accompanying drawings which illustrate presently preferred embodiments of the invention. In the drawings:

FIGS. 2A, 2B, 2C1, 2C2, and 2C3 schematically depict side views at various process stages of a first implementation of the first embodiment of the invention for forming three-dimensional structures by attaching individual single layers or by attaching individual single layers and a substrate, in which FIG. 2A shows three individual single layers; FIG. 2B shows the three individual single layers that have been stacked and aligned; FIG. 2C1 shows a formed three-dimensional structure without a substrate; and FIGS. 2C2 and 2C3 show two formed three-dimensional structures comprising a substrate.

DETAILED DESCRIPTION OF PREFERRED EMBODIMENTS OF THE INVENTION

Figure 1:
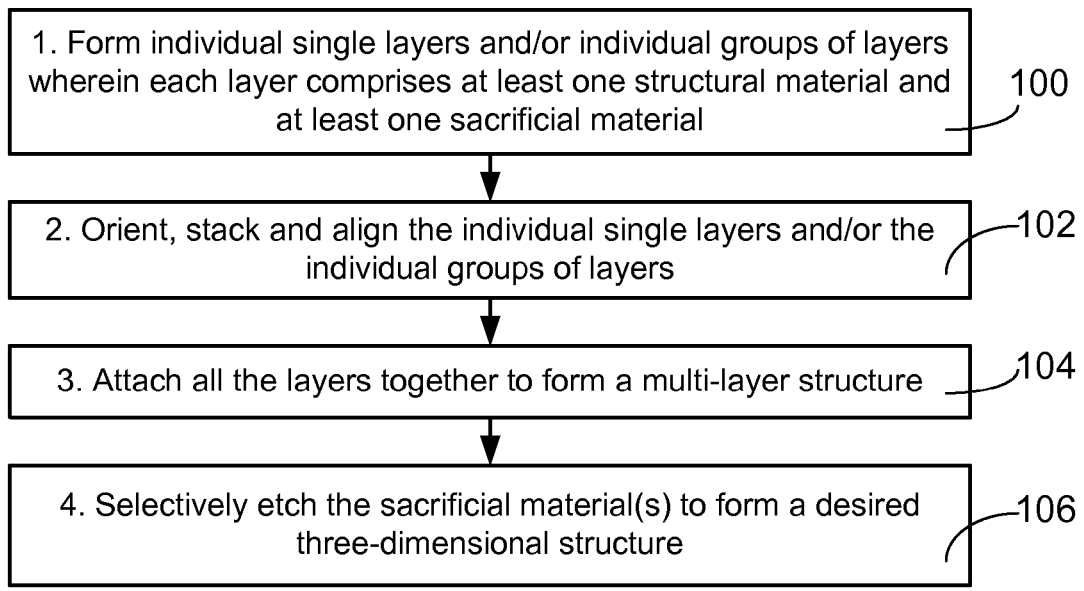
FIG. 1 provides a block diagram indicating the primary process steps of a first embodiment of the present invention for forming a three-dimensional structure via attaching individual single layers and/or individual groups of layers.

FIG. 1 provides a block diagram indicating the primary process steps of a first embodiment of the present invention for forming a three-dimensional structure via attaching individual single layers and/or individual groups of layers.

Block 100 sets forth a first step of the embodiment which involves forming individual single layers and/or individual groups of layers for constructing a desired three-dimensional structure. Note that an individual group of layers refers to a multi-layer structure. For example, an individual group of two layers means a two-layer structure. Each layer comprises at least one structural material and at least one sacrificial material. By definition, structural materials compose at least a portion of a desired three-dimensional structure. Sacrificial materials are used to support the structural materials that compose a portion of a three-dimensional structure and may be removed partially or completely during the fabrication of the three-dimensional structure. The structural materials and the sacrificial materials on the different layers may be the same, some same and some different, or totally different.

Block 102 sets forth a second step of the embodiment which involves orienting, stacking and aligning the individual single layers and/or the individual groups of layers so that the all layers are organized together in proper orientations and positions according to the layer configuration of the structure.

Block 104 sets forth a third step of the embodiment which involves attaching the all layers together to form a multi-layer structure via, e.g., pressing, heating, rolling, laminating, adhering, or combinations thereof.

Alternatively, in some cases, one-time attaching is not preferred. Then some of the layers may be attached first before attaching all the layers together.

Block 106 sets forth a fourth step of the embodiment which involves selectively etching away the sacrificial materials partially or completely to form the desired three-dimensional structure via, e.g., chemical etching, electrochemical etching, or the like.

Specific implementations will be discussed to teach the working principles of the first embodiment of the invention, but are not intended to limit the scope of the invention to those implementations presented. Rather, the scope of the invention is intended to be set by the claims interpreted in view of the specification.

A first implementation is shown in FIGS. 2A-2C3 which schematically depict side views at various stages of a process for forming a three-dimensional structure by attaching individual single layers according to the first embodiment of the invention.

FIG. 2A shows three single layers which are layer 110, layer 112 and layer 114. Each layer contains a sacrificial material 116 and a structural material 118. In this implementation, the three layers (110, 112 and 114) have the same sacrificial material 116 and the same structural material 118. However, those of skill in the art will understand that there is no limitation on the number of layers; that the dimensions of each layer may be the same or different; and that the sacrificial material and the structural material on each layer may be different. The structural material may be selected (but not limited to) from metals (e.g., nickel, aluminum and titanium), alloys (e.g., stainless steel and titanium alloys), semiconductors (e.g., silicon), ceramics (e.g., alumina), polymers (e.g., polyimide), composites and combinations of these materials. The sacrificial material should be selected so that it can be selectively etched with no damage or minor but acceptable damage on the structural material. For example, if a stainless steel is used as the structure material, copper can be selected to be a sacrificial material as copper can be etched away from the stainless steel with an ammoniacal copper etching solution which is compatible with stainless steel. The sacrificial material may be selected from metals, alloys, semiconductors, ceramics or polymers, etc.

FIG. 2A shows that each layer also contains a through hole, i.e., 120 on the layer 110, 122 on the layer 112 and 124 on the layer 114. The function of these holes is as alignment reference marks for aligning these layers so that the all three layer will be stacked in a predetermined configuration. Although only one through-hole on each layer is shown in FIG. 2A, each layer may contains other alignment reference marks (not shown) with other shapes such as square or triangle. Those of skill in the art will understand that there are other alignment methods which may also be used for this purpose.

The surfaces of the three layers need to be clean without contamination as the three layers will be stacked and attached together to form a multi-layer structure. If the surfaces are not clean and/or they contain oxide layers which need to be removed for obtaining a better adhesion between the layers, a cleaning process step may be added for this purpose. Techniques suited for such cleaning are well-known in the art. For example, organic solvents or inorganic cleaning solutions such as acetone, IPA (isopropyl alcohol), or alkaline solutions can be used to remove contaminations. Acid solutions such as sulfuric acid may be used to remove metal oxides.

FIG. 2B shows that the three layers 110, 112 and 114 have been stacked and aligned according to the predetermined configuration with the aid of the alignment reference marks 120, 122 and 124.

Then the stacked three layer structure 125 is attached together to form a multi-layer structure. One technique which may be used for this attaching purpose is diffusion bonding. Diffusion bonding is one of many solid-state joining processes wherein joining is accomplished without the need for a liquid interface (brazing) or the creation of a cast product via melting and resolidification (welding). Diffusion bonding can join metallic or non-metallic materials via atomic diffusion of elements at the joining interface. Diffusion bonding facilitates the joining of materials to produce components with no abrupt discontinuity in the microstructure and with a minimum of deformation, which is suitable for precision bonding for microfabrication. Diffusion bonding works for a wide range of materials including but not limited to metals, alloys, semiconductors and ceramics. Some examples are alumina-copper, molybdenum-molybdenum, nickel-nickel, and crystal quartz-stainless steel. If silicon is the structural material, silicon direct bonding or fusion bonding may be used. There is commercial silicon bonding equipment available for MEMS and microelectronics fabrication. The conditions and requirements of diffusion bonding and silicon fusion bonding can be obtained from handbooks, papers on professional journals, patents, and those of skill in the art.

FIG. 2C1 shows a free-standing three-dimensional structure 126 after the layers 110, 112 and 114 have been attached and the sacrificial material 116 has been removed. Chemical etching or electrochemical etching may be used to dissolve the sacrificial material in a proper etchant solution. In some cases, for the further protection of the structural materials such as metals and alloys in an etchant solution, proper corrosion inhibitors may be added to protect the structural material. Corrosion inhibitors should be selected to protect the structural material, but not influence the etching of the sacrificial material. Techniques for the above processes are generally known in the art.

FIG. 2C1 shows the free-standing three-dimensional structure 126. Alternatively, the layers 110, 112 and 114 may be attached to a substrate, which can be either done with the layer attaching process (the substrate acts as a layer to be attached like 110, 112 and 114) or done before or after the three layers have been attached. In the later cases, the attached three layers can be attached to the substrate via, e.g., diffusion bonding or the like, or the first layer of a structure (110 in this case) can be directly built on a desired substrate. Note that a substrate may be a pure solid substrate, or a substrate containing other components, or a device. If a pure solid substrate is used such as in FIG. 2C2, it may be machined to form some structures on it before or after removing the sacrificial material. FIG. 2C2 shows that the structure 126 is attached on a substrate 128 where the sacrificial material has been etched. The substrate may be a metal, a semiconductor material, a ceramic material or any suitable material.

Instead of attaching structures on one side of a substrate, another alternative is to attach structures on both sides of a substrate. FIG. 2C3 shows that one structure 126 is attached on the top surface of the substrate 128 while another same structure 129 is attached on the bottom surface of the substrate 128.

Optionally, fabricated three-dimensional structures may be post-treated for the enhancement of their performance or for the protection from their various service environments. For example, a less conductive structure material may be coated a thin layer of a higher conductive material by using electroplating or electroless plating. Copper microstructures serve as RF (Radio Frequency) MEMS components. However, copper can be easily oxidized or corroded. To protect copper from corrosion, copper structures may be dipped in a copper surface treatment solution containing copper corrosion inhibitors. For example, benzotriazole (BTA, $C_6H_4N_3H$) is one of the most effective inhibitors for copper, which can form a thin (<50 Å) protective polymeric film on copper. A suitable solution may contain 0.1%-1% (weight) BTA. Copper structures may be treated in one of such solutions in a preferred temperature range of 20-50° C. Those of skill in the art will understand that there are other copper inhibitors (either in the same class or in different classes) for copper surface treatment. If aluminum or aluminum alloy structures are used, aluminum anodizing processes may be used to form a protective oxide coating on aluminum or aluminum alloy structures.

A second implementation is shown in FIGS. 3A-3D which schematically depict side views at various stages of a process for forming a three-dimensional structure by attaching individual single layers and individual groups of layers according to the first embodiment of the invention.

Figure 3A:
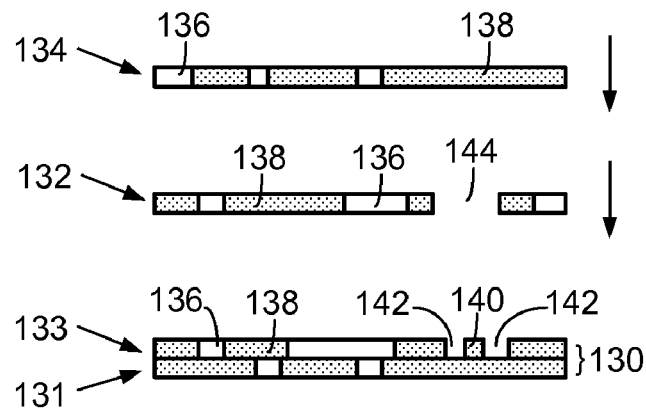
FIGS. 3A-3D schematically depict side views at various process stages of a second implementation of the first embodiment of the invention for forming a three-dimensional structure by attaching individual single layers and individual groups of layers.

FIG. 3A shows a group of two layers 130 which has a top-layer 133 and a bottom-layer 131, and two single layers 132 and 134. Each layer contains a sacrificial material 136 and a structural material 138. In this implementation, the all layers (131, 132, 133, 134) have the same sacrificial material 136 and the same structural material 138. Layer groups containing more than one layer may be formed by attaching (e.g., diffusion bonding) individual single layers, by attaching individual single layers and individual sub-groups of layers, by building layers successively, or by using various combinations of the above approaches. In this implementation, the top-layer 133 has a circular (or other closed shapes) opening 142 extending from the top surface of the top-layer 133 through the thickness of the top-layer 133 to the top surface of the bottom-layer 131. There is a structural feature 140 in the opening 142 sitting on the top surface of the bottom-layer 131. One purpose of this implementation is to illustrate how to make a three-dimensional structure with a sealed cavity or hollow. The feature 140 is isolated or disconnected from the rest of the layer 133. Note that a sacrificial material usually is used to combine all structural components or features together on a layer. But in the case of building sealed cavities, a sacrificial material can not be used to combine isolated features in the cavities as the sacrificial material can not be etched away in the sealed cavities. To support the isolated feature 140, the layer 133 can be built on the layer 131. It is the layer 131 that supports the isolated feature 140. This example reveals one reason why groups of layers are needed to build three-dimensional structures in addition to just using individual single layers. Another reason for using groups of layers may be more cost-effective for forming groups of layers than forming single layers in some cases. The layer 132 contains a through opening 144 (circular or other closed shapes) which will be a part of the sealed cavity to be formed.

Figure 3B:
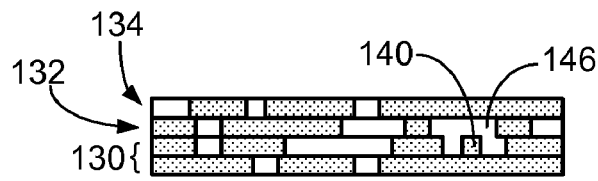

FIG. 3B shows that the three components 130, 132 and 134 have been stacked and aligned according to the predetermined configuration with the aid of alignment reference marks (not shown).

Figure 3C:
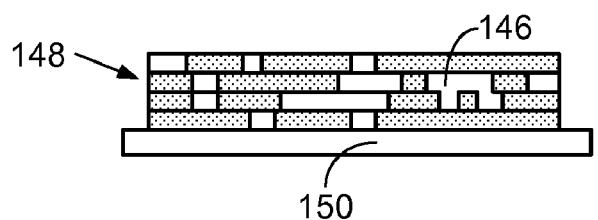

FIG. 3C shows that the three components 130, 132 and 134, and a substrate 150 have been attached together via, e.g., diffusion bonding. Note that the structure 148 contains a sealed cavity 146.

Figure 3D:
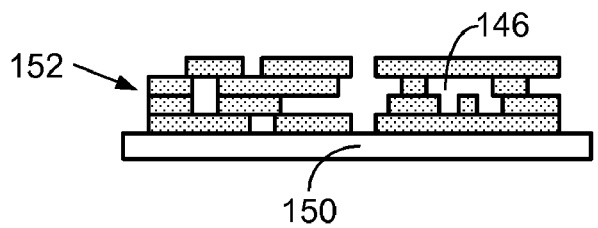

FIG. 3D shows a final three-dimensional structure 152 containing the sealed cavity 146 after the sacrificial material 136 has been etched.

A third implementation is shown in FIGS. 4A-4D which schematically depict side views at various stages of a process for forming a three-dimensional structure by attaching individual single layers which do not have continuous flat surfaces according to the first embodiment of the invention.

Figure 4A:
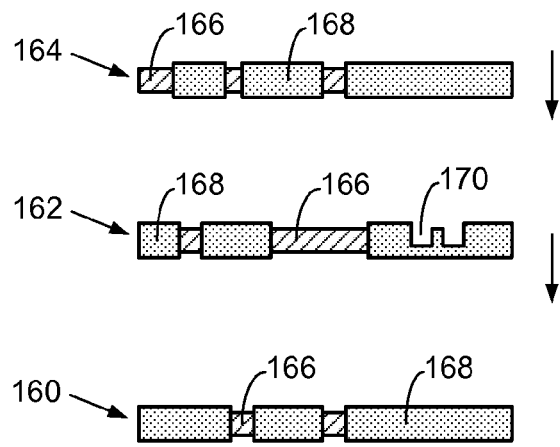
FIGS. 4A-4D schematically depict side views at various process stages of a third implementation of the first embodiment of the invention for forming a three-dimensional structure by attaching individual single layers which do not have continuous flat surface.

FIG. 4A shows three single layers which are 160, 162 and 164. Each layer contains a sacrificial material 166 and a structural material 168. In this implementation, the three layers (160, 162 and 164) have the same sacrificial material 166 and the same structural material 168. The sacrificial material 166 on each layer is thinner than the structural material 168. In addition, the surface levels of the sacrificial material 166 are below the surface levels of the structural material 168. In other words, the sacrificial material surfaces will not be involved in an attaching process as they can not contact other surfaces. In fact, our ultimate purpose is to bond the structural material components on each layer together. If we can leave out the sacrificial material, it may simplify the attaching process such as diffusion bonding. In addition, the total bonding area is reduced due to the non-involvement of the sacrificial material. Diffusion bonding needs to apply a suitable pressure on the layers. If the total bonding area decreases, the required bonding force will decrease accordingly. This kind of layers may be made either by etching a portion of sacrificial material from a layer where the sacrificial material surfaces are flush to the structural material surfaces (for example, see layer 110 in FIG. 2A), or by other proper methods. The layer 162 also contains a blind via 170. The blind via can be micromachined on the structural material by laser micromachining, chemical or electrochemical etching, micro-electro-discharge machining, DRIE (Deep Reactive Ion Etching) if the structural material is silicon, or the like. This implementation teaches that layers for constructing three-dimensional structures are not necessary to have continuous flat surfaces. Layers may have through openings or blind openings as long as these openings do not disintegrate the layers.

Figure 4B:
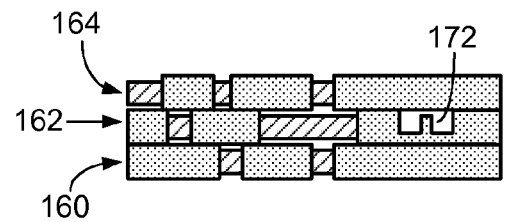

FIG. 4B shows that the three layers 160, 162 and 164 have been stacked and aligned according to the predetermined configuration with the aid of alignment reference marks (not shown) or other alignment methods.

Figure 4C:
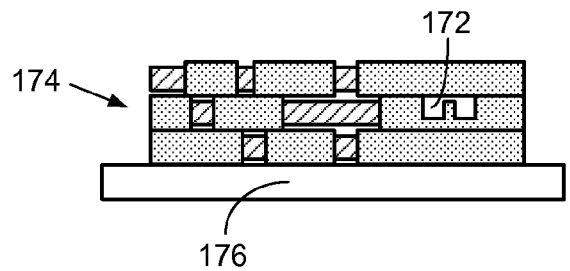

FIG. 4C shows that the three layers 160, 162 and 164, and a substrate 176 have been attached together by diffusion bonding or the like. Note that the structure 174 contains a sealed cavity 172. This implementation reveals another way to make sealed cavities by micromachining a structural material to form a blind via instead of using the two-layer style discussed above in the second implementation.

Figure 4D:
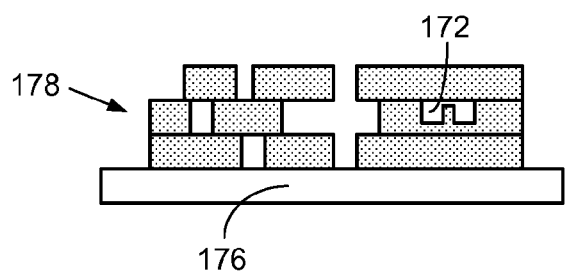

FIG. 4D shows a final three-dimensional structure 178 containing the sealed cavity 172 after the sacrificial material 166 has been etched.

The above specific implementations are intended to illustrate the working principles of the first embodiment of the invention. Various other implementations of the first embodiment of the present invention exist. Various other alternatives and modifications will be apparent to those of skill in the art upon review of the teachings herein. Further implementations and alternatives are possible by combining the teachings disclosed explicitly herein.

As this disclosed method (the first embodiment of the invention) is a parallel process, we do not need to build all the layers successively for constructing a three-dimensional structure. Instead, we can build individual single layers and groups of layers separately and simultaneously. We can also attach them together simultaneously. Therefore the production speed can be greatly increased.

As individual single layers and individual groups of layers are construction blocks for building three-dimensional structures, this present invention discloses various approaches to achieve the goal set forth in the block 100 in FIG. 1.

Figure 5:
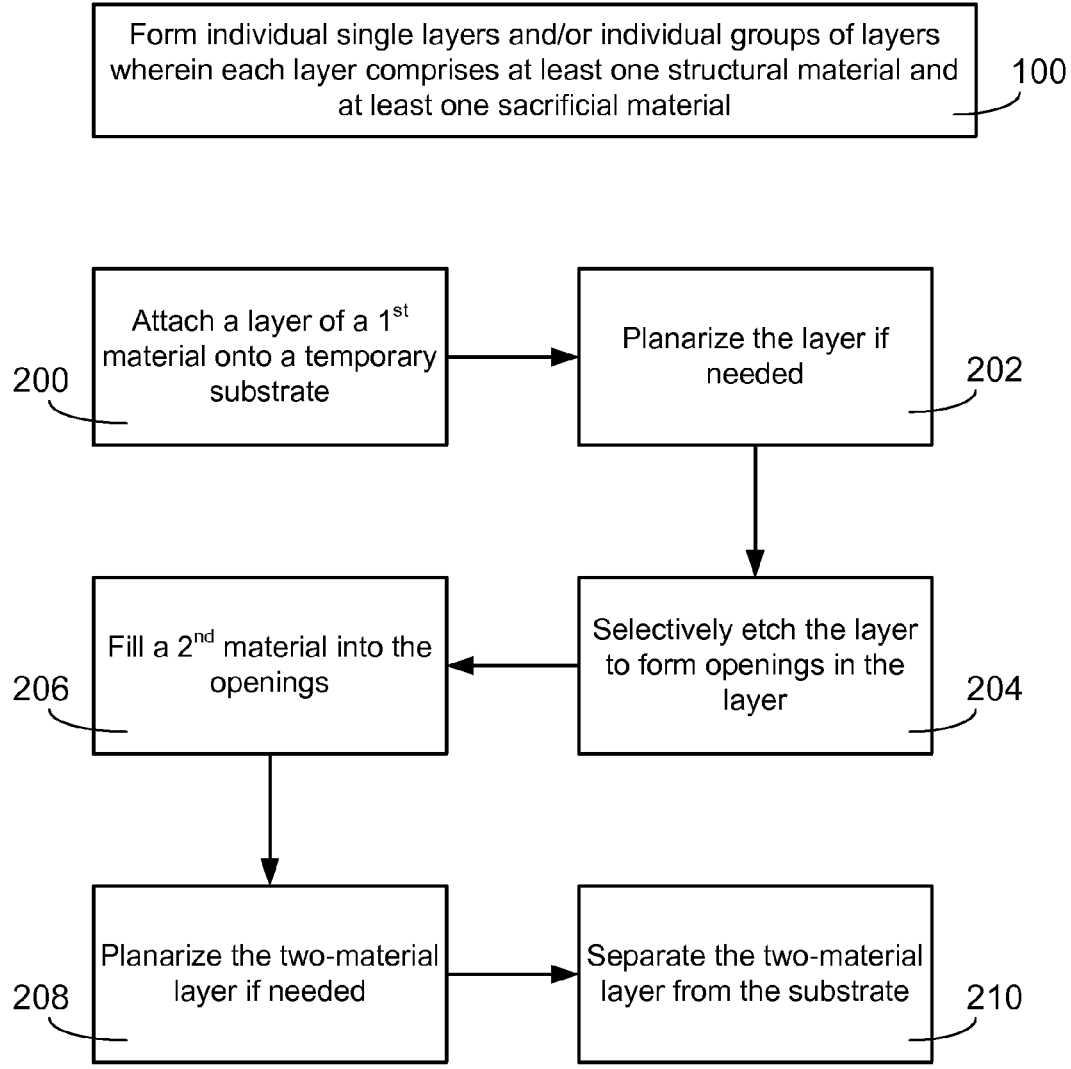
FIG. 5 provides a block diagram indicating a first approach for building individual multi-material single layers and individual groups of multi-material layers.

FIG. 5 provides a block diagram indicating a first approach for building individual multi-material single layers and individual groups of multi-material layers. The first block 100 sets forth the goal of this approach. The primary steps of this approach for forming a single layer comprising two materials are shown from block 200 to block 210.

Block 200 sets forth a first step of the approach which involves attaching a layer of a first material onto a temporary substrate by using diffusion bonding, laminating, rolling, cladding or the like. The function of a temporary substrate is to be a mechanical support on which a desired multi-material layer will be formed. The desired layer will be separated from the substrate to become a free-standing layer after it is built on the substrate. The desired layer may be directly built on the substrate and then separated from the substrate by the peeling of the layer away from the substrate, by the machining of the substrate, by the dissolving of the substrate, and by the combinations thereof. Alternatively, the desired layer may be built on a releasing layer on the substrate. The releasing layer will be dissolved to release the desire layer after the desired layer is built.

Block 202 sets forth a second step (optional) of the approach which involves planarizing the attached layer of the first material. This step needs to be applied if (1) the layer needs to be machined to a predetermined thickness, (2) the layer needs to have a uniform thickness, and/or (3) the layer surface needs to achieve a flatness and smoothness for the following processing steps. Many machining techniques may be used for this purpose, e.g., diamond lapping, diamond turning, chemical-mechanical polishing, milling, grinding or the like.

Block 204 sets forth a third step of the approach which involves selectively etching the attached layer of the first material to form openings in the layer. Selective etching may be operated by using laser micromachining through a pattern mask. Selective etching may be operated by using chemical etching, electrochemical etching or deep reactive ion etching if the layer material is silicon to the layer on which a mask material (e.g., a photoresist) is patterned so that the part to be etched is exposed. Selective etching may also be operated by using ultrasonic machining or electrical discharge machining. Those of skill in the art will understand that there are other selective etching methods. The produced openings may be through (from the top side of the layer to the bottom side of the layer) or blind.

Block 206 sets forth a fourth step of the approach which involves filling a second material into the openings in the layer which was selectively etched. There are many filling methods available for handling various materials. For example, electrochemical deposition such as electroplating or electroless plating may be used to fill into the openings with a metal, alloy, oxide, conductive polymer, or composite. Physical deposition such as vacuum deposition (PVD, CVD, sputtering, etc.) can deposit semiconductor materials, metals and alloys. Physical deposition such as thermal and cold spray can deposit metals, alloys and ceramics. Liquid polymers may be sprayed or spread into the openings and then be solidified by use of heat, radiation or the like. Those of skill in the art will understand that there are also other deposition methods suitable for this purpose.

Block 208 sets forth a fifth step of the approach which involves planarizing the two-material layer. This step needs to be operated if the following requirements should be met.

(1) The two-material layer needs to be machined to a predetermined thickness;

(2) Both materials need to be exposed and both material surfaces need to be flush; and/or (3) The two-material layer surface needs to achieve a predetermined flatness and smoothness.

Again, many machining techniques may be used for this purpose, e.g., diamond lapping, diamond turning, chemical-mechanical polishing, milling, grinding or the like.

Block 210 sets forth a sixth step of the approach which involves separating the two-material layer from the temporary substrate. This operation may be done by peeling the layer away from the substrate, machining the substrate, dissolving the substrate, dissolving a releasing layer, and combinations thereof.

To make a multi-material layer containing more than two materials, the operations of the third, the fourth and the fifth step may be repeated a plurality of times to fill different materials into the openings generated in the layer before the operation of the sixth step. The sixth step is then operated to separate the multi-material layer from the substrate. Those skill in the art will understand that single layers may have discontinuous surfaces and may contain through openings or blind openings by micromachining the layers.

To make an individual group of multi-material layers, the operation steps discussed above may be repeated a plurality of times before the operation of the sixth step comprising: (1) attaching a layer to a previously formed multi-material layer, (2) micromachining the attached layer to form a multi-material layer (the operations of the third, the fourth and the fifth step). The sixth step is then operated to separate the group of multi-material layers from the substrate. Alternatively, single multi-material layers can be attached together to form an individual group of layers. Those skill in the art will understand that the layers in a group may have many variations. For example, the layers may all have the same dimensions or different dimensions. Some of the layers may have the same dimensions. Each layer in the group may contain the same number of materials or different number of materials. Each layer may contain the same materials, some the same and some different materials, or totally different materials. All or some of the layers may have discontinuous surfaces, which may contain through openings or blind openings such as the layers 132 and 133 shown in FIG. 3A and the layer 162 in FIG. 4A.

If a single multi-material layer or a group of multi-material layers is curved after separation due to, e.g., the effect of stress. A proper flattening process via pressing, rolling, heating, or combination thereof may be used to obtain a flat product.

Specific implementations will be discussed to teach working principles of the first approach of the invention for forming single multi-material layers or groups of multi-material layers, but are not intended to limit the scope of the invention to those implementations presented. Rather, the scope of the invention is intended to be set by the claims interpreted in view of the specification.

FIGS. 6A-6G provide schematic illustrations of side views at various process stages of an implementation of the first approach for building a single layer comprising two materials, 316L stainless steel and nickel.

Figure 6A:
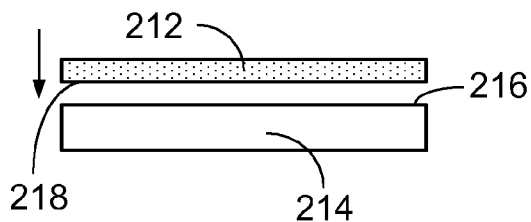
FIGS. 6A-6G provide schematic illustrations of side views at various process stages of an implementation of the first approach for building a single layer comprising two materials, 316L stainless steel and nickel.

In FIG. 6A, a 316L stainless steel layer 212 with a proper thickness is bonded to a copper substrate 214. High precision stainless steel foils may be used as they not only have smooth and flat surfaces, but also have uniform thicknesses. Alternatively, the both sides of a stainless layer can be planarized by using diamond lapping and polishing or the like so that the both surfaces become flat and smooth and the layer has a uniform thickness. The copper substrate 214 has two functions. One function is to provide a base on which a composite or multi-material layer which contains at least two materials (one of them is stainless steel) can be built. The other function is to act as a releasing layer. It means that after the multi-material layer is fully built on it, the copper substrate 214 will be dissolved so that the free-standing multi-material layer can be obtained. The copper top surface 216 to be bonded to the stainless steel layer 212 may be flat and smooth. Either diamond lapping or diamond turning can be employed to machine the copper surface 216 to be flat and smooth. The stainless steel layer 212 can be attached onto the copper substrate 214 via, e.g., diffusion bonding with a proper pressure on the two materials and a proper bonding temperature and time in a vacuum chamber. Diffusion bonding is a known art. All required bonding parameters can be found on books and literature or can be obtained from those skill in the art. Alternatively the parameters can be obtained by experiments. Right before bonding, the two materials may need to be pretreated to make two bonding surfaces 216 and 218 clean and active. For example, acetone cleaning followed by acid dipping may be used for this purpose.

Figure 6B:
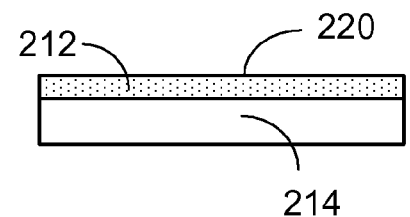

FIG. 6B shows the bonded copper substrate 214 and stainless steel layer 212 after diffusion bonding. The top surface 220 of the stainless steel layer 212 may be planarized via diamond lapping and polishing or the like to achieve a desired surface flatness and smoothness, and a desired thickness if needed.

Figure 6C:
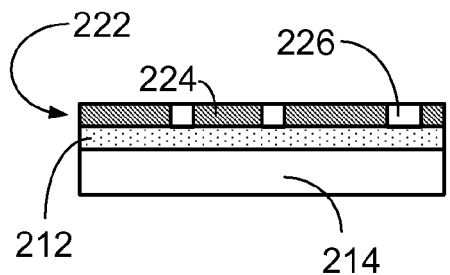

Many methods may be used to selectively etch the stainless steel layer 212 to form a desired pattern, e.g., electrochemical photo etching, laser machining or the like. In this implementation, laser micromachining is used to selectively remove part of the stainless steel layer 212 to form a desired pattern. In FIG. 6C, a photomask 222 with a desired pattern is placed over the stainless steel layer 212. The photomask 222 has light barriers 224 which stop laser light and protect the underneath stainless steel and light apertures 226 through which laser light can etch the underneath stainless steel. An excimer laser may be used to etch the stainless steel layer 212 to form the desired pattern (openings) by exposing the stainless steel layer 212 through the photomask 222. The laser machining process needs to be precisely control to just remove all the exposed stainless steel through all the thickness down to the copper top surface, but not damage the copper underneath the removed stainless steel. Note that alignment reference marks (used for aligning individual layers and/or individual groups of layers for forming three-dimensional structures) may be included in the desired pattern on the photomask 222. In terms of the fabrication of alignment reference marks, alternatively, we can make them by using the selective etching of a multi-material layer, e.g., with laser machining, after the layer has been built to form the alignment marks.

Figure 6D:
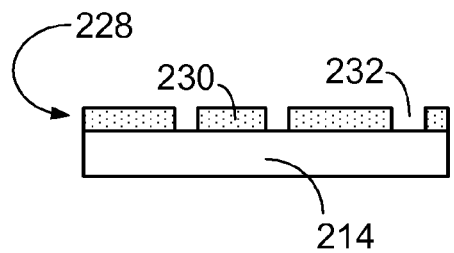

FIG. 6D shows the etching result after the photomask 222 has been removed, where the patterned stainless steel 228 has stainless steel features 230 and openings 232.

Figure 6E:
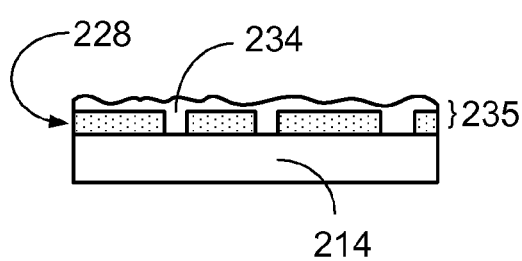

In FIG. 6E, a second material 234, nickel, is blanket deposited over the exposed copper and the stainless steel. Nickel deposition can be operated in a nickel plating tank via electrodeposition. A suitable nickel plating bath is a nickel sulfamate plating bath although other nickel plating baths may also be used. The internal stress of the nickel 234 may be controlled to be near zero by adding a suitable stress reducer in the nickel sulfamate bath. Suitable nickel sulfamate plating baths and stress reducers are commercial available. For example, Techni S Nickel Sulfamate bath and JB-100 (stress reducer) can be purchased from Technic, Inc. Before nickel plating, the alignment reference marks (openings, not shown) in the stainless steel 228 need to be covered with an insulating material (e.g., AZ4620, a photoresist) to prevent from being filled with nickel. Still before nickel plating, the exposed copper and the stainless steel may be cleaned and activated using such as chemical cleaning or ultrasonic cleaning followed by acid activation or the application of a nickel strike. Ensure that even the lowest points of the nickel 234 reach a predetermined thickness for nickel deposition.

Figure 6F:
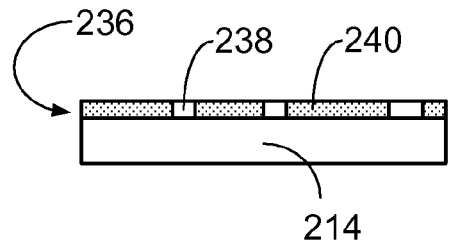

The two-material layer 235 consisting of the stainless steel features 230 and the nickel 234 shown in FIG. 6E is planarized (e.g., diamond lapping or the like) to form a desired two-material layer 236 shown in FIG. 6F. After planarization, both stainless features 240 and the nickel features 238 are exposed and at the same level. The top surface of the layer 236 reaches a predetermined flatness and smoothness. The layer 236 also reaches a predetermined thickness.

Optionally, the above steps (selective etching, blanket deposition and planarization) may be repeated a plurality of times to form a multi-material layer. Note that blanket deposition may be used to deposit different materials. Also note that blanket deposition may be electrodeposition, electroless deposition, physical deposition such as vacuum deposition and spray, or the like.

Further optionally, the above steps (attaching, selective etching, blanket deposition and planarization) may be repeated a plurality of times to form a group of multi-material layers.

Figure 6G:
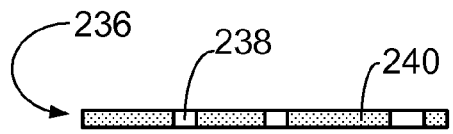

To separate the two-material layer 236 from the copper substrate 214 shown in FIG. 6F, the copper substrate 214 may be dissolved in a copper etchant. For example, Enstrip® C-38 manufactured by Enthone Inc. is a very effective copper etchant which is compatible with nickel and stainless steels. FIG. 6G shows the free-standing layer 236. If the layer 236 curls due to stress effect after separation, a mechanical approach may be used to flatten the layer 236, e.g., using a rolling machine, a pressing machine, or the like.

The above steps may be repeated to build all the required individual single two-material layers and/or individual groups of two-material layers which, after stacking, aligning and attaching together, compose a multi-layer structure.

Finally, the nickel is selectively etched away by using a nickel etchant to release a desired three-dimensional structure. There are many commercial nickel etchants. For example, we can use Nickel Stripper M-7 manufactured by Atotech Inc. to etch away nickel. The etchant is compatible with stainless steels. Alternatively, we can also use a nitric acid solution, by mixing one part (volume) concentrated nitric acid with one part (volume) water together, to dissolve nickel. The nitric acid solution is also compatible with SS 316L.

FIGS. 7A-7K provide schematic illustrations of side views at various process stages of an implementation of the first approach for building a single layer comprising two materials, silicon and nickel.

Figure 7A:
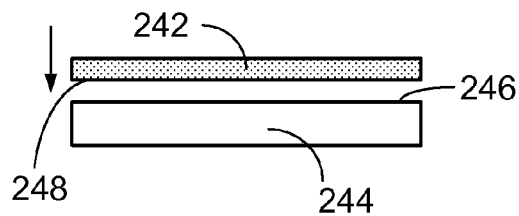
FIGS. 7A-7K provide schematic illustrations of side views at various process stages of an implementation of the first approach for building a single layer comprising two materials, silicon and nickel.

In FIG. 7A, a double-side polished silicon wafer 242 with a proper thickness is attached to a copper substrate 244. The copper substrate 244 has two functions. One function is to provide a base on which a two-material (silicon and nickel) layer can be built. The other function is to act as a releasing layer. After the two-material layer is fully built on it, the copper substrate 244 will be dissolved so that the free-standing two-material layer can be obtained. Copper surface 246 to be attached to silicon wafer surface 248 needs to be flat and smooth. Either diamond lapping or diamond turning can be employed to machine the copper surface 246 to become flat and smooth. The silicon wafer 242 can be attached onto the copper substrate 244 via, e.g., diffusion bonding with a proper pressure on the two materials and a proper bonding temperature and time in a vacuum chamber. Diffusion bonding is a known art. All required bonding parameters can be found on books and literature. Alternatively the required parameters can be obtained by experiments. Right before bonding, the two materials may be pretreated to make the two bonding surfaces 246 and 248 clean and active. For example, acetone cleaning followed by acid dipping may be used for this purpose.

Figure 7B:
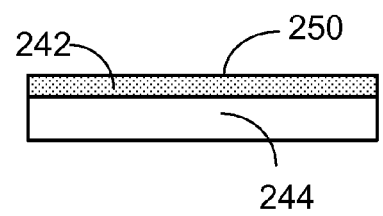

FIG. 7B shows the bonded copper substrate 244 and silicon wafer 242 after diffusion bonding. The top surface 250 of the silicon wafer 242 may be planarized by diamond lapping and polishing or CMP (Chemical Mechanical Polishing) to achieve a desired thickness, surface flatness and smoothness if the bonding process degrades the silicon surface quality.

Figure 7C:
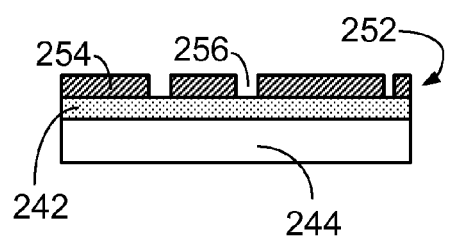

Many methods may be used to selectively etch the silicon wafer 242 to form a desired pattern, e.g., chemical etching, electrochemical etching, DRIE (Deep Reactive Ion Etching), laser micromachining, or the like. In this implementation, DRIE is used to etch the silicone wafer 242. In FIG. 7C, a photoresist such as AZ4620 is applied and UV-exposed through a photomask (not shown) to form a pattern of photoresist 252 on the silicon wafer 242 via a standard cleanroom photolithography process. The photoresist pattern 252 contains photoresist features 254 and openings 256 which extends from the top surface of the photoresist 252 through the thickness of the photoresist to the top surface of the silicon wafer 242. Note that alignment reference marks (openings) may be included in the photoresist pattern 252. The purpose of the alignment marks is for aligning individual layers and/or individual groups of layers for final attaching or bonding to form a multi-layer structure.

Figure 7D:
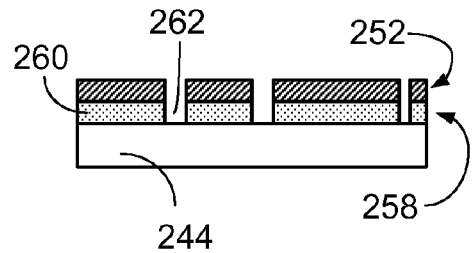

The whole combination of 242, 244 and 252 is placed in a DRIE machine. The silicon which is not covered with the photoresist features 254 is etched away down to the top surface of the copper substrate 244. FIG. 7D shows that a silicon pattern 258 is formed after DRIE, which contains silicon features 260 and through openings 262. A cleaning process such as oxygen plasma or chemical cleaning may be used to remove residues generated during DRIE on the exposed copper area of the copper substrate 244, and on the sidewalls of the openings of the silicon pattern 258.

The photoresist 252 (an insulating material) is better to leave untouched after DRIE as it can act as a plating mask to prevent from the growth of nickel (from blanket deposition) to the top silicon surface or prevention from the deposition of nickel on the top silicone surface if the silicon is highly conductive. However, a blanket nickel deposition may also be done if the photoresist 252 has to be removed before nickel electrodeposition.

Figure 7E:
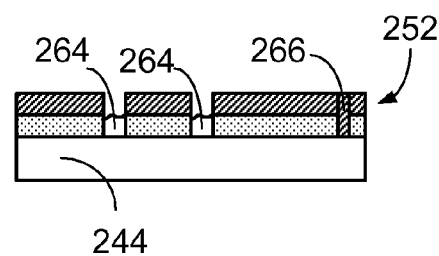

Nickel 264 is filled into the silicon pattern 258 via nickel electroplating shown in FIG. 7E. If through openings (closed geometries such circles) are needed on the final layer, these openings need to be covered with an insulating material 266 (e.g., AZ4620, a photoresist) shown in FIG. 7E before nickel plating to prevent from being filled with nickel. A suitable nickel plating bath is a nickel sulfamate plating bath although other nickel plating baths may also be used. The internal stress of the nickel 264 may be controlled to be near zero by adding a suitable stress reducer in the nickel sulfamate bath. Suitable nickel sulfamate plating baths and stress reducers are commercial available. For example, Techni S Nickel Sulfamate bath and JB-100 (stress reducer) can be purchased from Technic, Inc. Ensure that even the lowest points of the nickel 264 reach a predetermined thickness. After nickel plating, the photoresist 252 is stripped. A nickel-silicon composite layer 268 is shown in FIG. 7F, which contains a though opening 270.

Figure 7F:
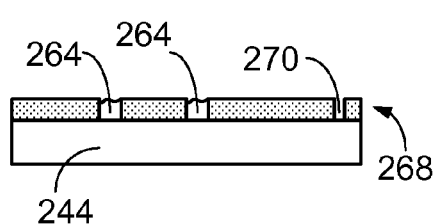
Figure 7G:
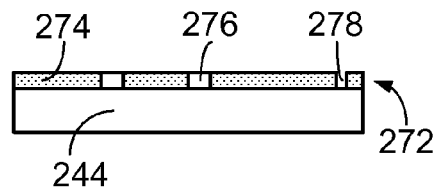

The two-material layer 268 shown in FIG. 7F is planarized (e.g., diamond lapping, CMP or the like) to form a desired two-material layer 272 shown in FIG. 7G. After planarization, both silicon features 274 and nickel features 276 are exposed and at the same level; the top surface of the layer 272 reaches a predetermined flatness and smoothness; and the layer 272 also reaches a predetermined thickness.

Figure 7H:
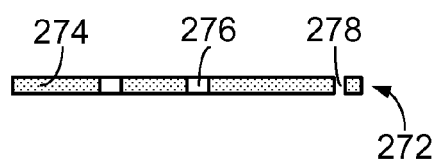

To separate the two-material layer 272 from the copper substrate 244 shown in FIG. 7G, the copper substrate 244 can be dissolved in a copper etchant. For example, Enstrip® C-38 manufactured by Enthone Inc. is a very effective copper etchant which is compatible with nickel and silicon. FIG. 7H shows the free-standing layer 272 after the copper 244 has been etched, which has a though opening 278.

Figure 7I:
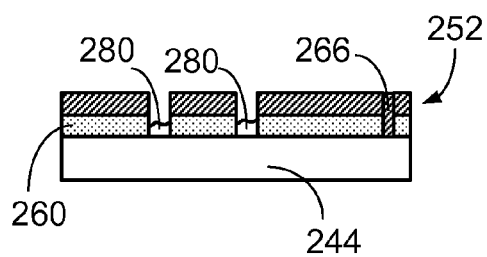
Figure 7J:
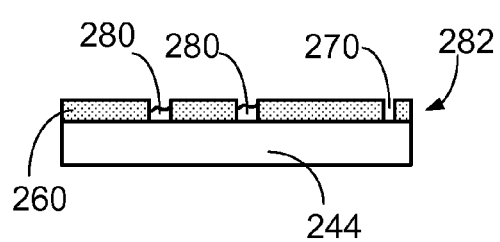
Figure 7K:
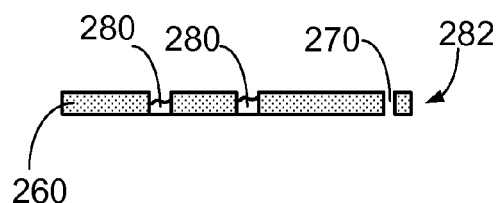

Alternatively, another process scheme shown in FIGS. 7I-7K may be used to avoid the above planarization process step after nickel plating. The function of a sacrificial material is to integrate all structural elements on a layer together as there are isolated structural elements which do not link with other structural elements. The integrity of a layer will be lost without a sacrificial material which acts like an adhesive. Although finally we bond all layers together to form a multi-layer structure, in fact, we only need to bond the structural elements on the layers together. Therefore to avoid planarization, we can deposit nickel 280 below the top surface of the silicon wafer 260 shown in FIG. 7I. FIG. 7J shows a desired two-material layer 282 where the photoresist has been stripped. FIG. 7K shows the two-material layer 282 after dissolving the copper substrate 244. As the nickel 280 is below the top surface of the silicon 260, there is no need to planarize the two-material layer as long as the silicon thickness meets the fabrication requirement.

The above steps may be repeated to build all the required individual single two-material layers and/or individual groups of two-material layers which, after stacking, aligning and attaching together, compose a multi-layer structure.

Diffusion bonding is a suitable bonding approach. Alternatively, if a portion of nickel of all layers is etched with a nickel etchant so that the nickel surfaces are below the silicon surfaces. Then, we stack, align and attach all the layers together. We can use silicon fusion bonding as an attaching approach because the nickel will not be involved in the attaching process. Finally, the nickel is selectively etched away by using a nickel etchant to release the desired three-dimensional silicon structure. There are many commercial nickel etchants. For example, we can use Nickel Stripper M-7 manufactured by Atotech Inc. to etch away nickel. The etchant is compatible with silicon. Alternatively, we can also use a nitric acid solution, by mixing one part (volume) concentrated nitric acid with one part (volume) water together, to dissolve nickel. The nitric acid solution is also compatible with silicon.

Figure 8:
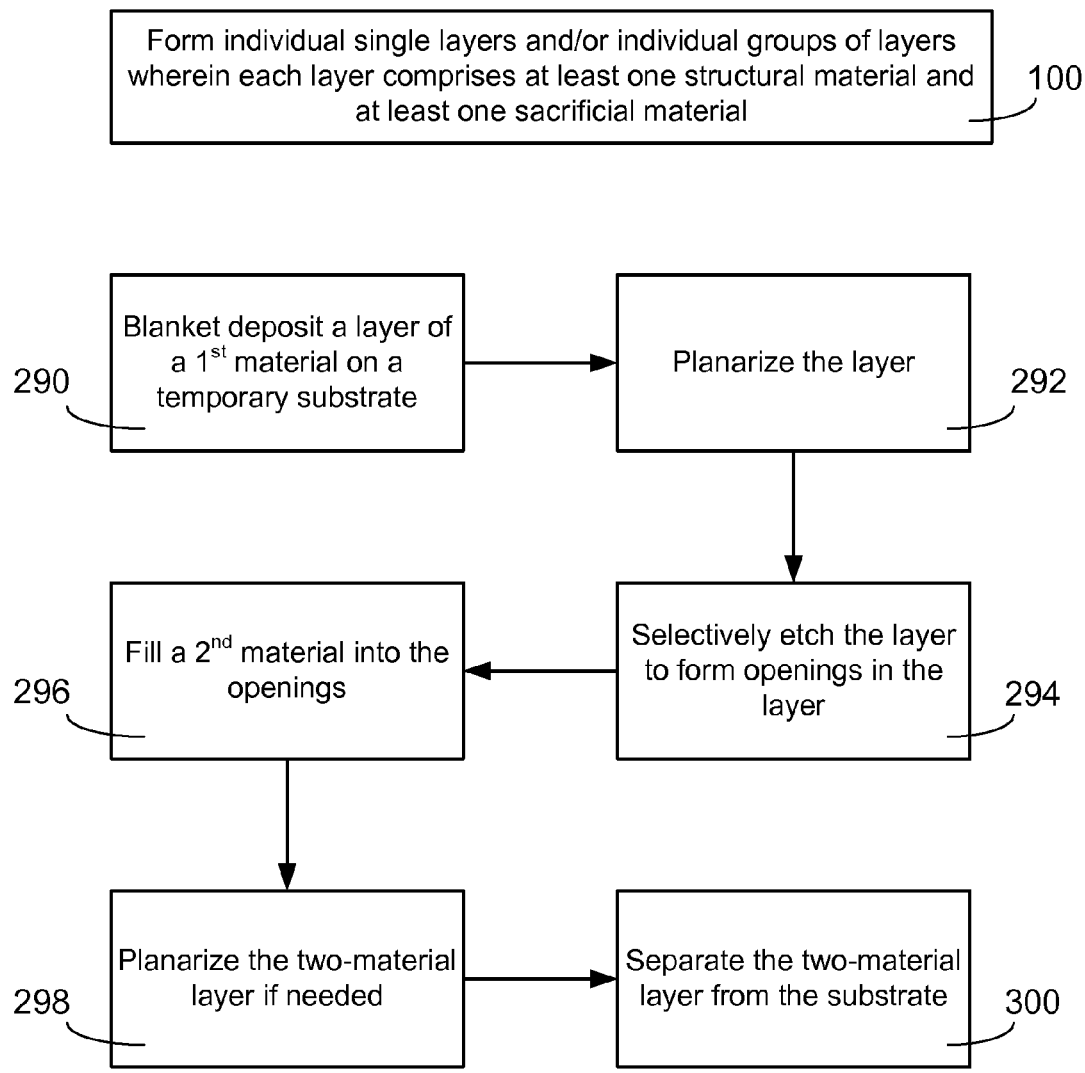
FIG. 8 provides a block diagram indicating a second approach for building individual multi-material single layers and individual groups of multi-material layers.

FIG. 8 provides a block diagram indicating a second approach for building individual multi-material single layers and individual groups of multi-material layers, which is similar to that of the first approach with the exception that a layer of a first material is deposited instead of being attached. The first block 100 sets forth the goal of this approach. The primary steps of this approach for forming a single two-material layer are shown from block 290 to block 300.

Block 290 sets forth a first step of the approach which involves blanket depositing a layer of a first material onto a temporary substrate by various deposition methods. For example, electrochemical deposition such as electroplating or electroless plating may be used to produce metals, alloys, oxides, conductive polymers, or composites. Physical deposition such as vacuum deposition (PVD, CVD, sputtering, or the like) can deposit semiconductor materials, metals and alloys. Physical deposition such as thermal and cold spray can deposit metals, alloys and ceramics. Liquid polymers may be sprayed or spread and then be solidified by use of heat, radiation or the like. Those of skill in the art will understand that there are also other deposition methods suitable for this purpose. The thickness of the deposited layer should be thick enough to meet the requirements of the following process steps.

Block 292 sets forth a second step of the approach which involves planarizing the deposited layer so that the layer has a flat and smooth surface, and a predetermined thickness. Various methods may be selected for this purpose such as diamond lapping, diamond polishing, CMP, diamond turning, milling, grinding, or the like.

Blocks 294-300 are similar to blocks 204-210 of the first approach in FIG. 5.

Block 294 sets forth a third step of the approach which involves selectively etching the deposited layer of the first material to form openings in the layer.

Block 296 sets forth a fourth step of the approach which involves filling a second material into the openings in the layer which was selectively etched.

Block 298 sets forth a fifth step of the approach which involves planarizing the two-material layer. This step needs to be operated if the following requirements should be met.

(1) The two-material layer needs to be machined to a predetermined thickness;

(2) Both materials need to be exposed and both material surfaces need to be flush; and/or (3) The two-material layer surface needs to achieve a predetermined flatness and smoothness.

Block 300 sets forth a sixth step of the approach which involves separating the two-material layer from the temporary substrate. This operation may be done by peeling the layer away from the substrate, machining the substrate, dissolving the substrate, dissolving a releasing layer, and combinations thereof.

Like the first approach, to make a multi-material layer, the operations of the third, the fourth and the fifth steps may be repeated a plurality of times to fill different materials into the openings generated in the layer before the operation of the sixth step. The sixth step is then operated to separate the multi-material layer from the substrate.

Still like the first approach, to make a group of multi-material layers, the operation steps 1 to 5 discussed above may be repeated a plurality of times before the operation of the sixth step. Note that in this case for the step 1 a given layer is deposited on the finished previous layer. For example, a second layer is deposited on the finished first layer which is on the substrate. The sixth step is then operated to separate the group of multi-material layers from the substrate.

Lastly, if a single multi-material layer or a group of multi-material layers is curved after separation due to, e.g., the effect of stress. A proper flattening process via pressing, rolling, heating, or combination thereof may be used to obtain a flat product.

A specific implementation will be discussed to teach working principles of the second approach of the invention for forming single multi-material layers or groups of multi-material layers, but are not intended to limit the scope of the invention to the implementation presented. Rather, the scope of the invention is intended to be set by the claims interpreted in view of the specification.

FIGS. 9A-9G provide schematic illustrations of side views at various process stages of an implementation of the second approach for building a single layer comprising two materials, gold and nickel.

Figure 9A:
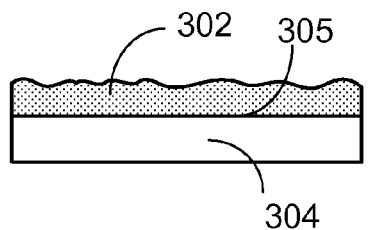
FIGS. 9A-9G provide schematic illustrations of side views at various process stages of an implementation of the second approach for building a single layer comprising two materials, gold and nickel.

In FIG. 9A, Nickel 302 is blanket electrodeposited on a copper substrate 304. In this implementation, copper surface 305 was planarized to be flat and smooth before nickel plating. The copper surface 305 was also cleaned and activated in an acid solution such as 5% (volume) sulfuric acid solution right before nickel plating. A suitable nickel plating bath is a nickel sulfamate plating bath although other nickel plating baths may also be used. The internal stress of the nickel deposit 302 may be controlled to be near zero by adding a suitable stress reducer in the nickel sulfamate bath. Suitable nickel sulfamate plating baths and stress reducers are commercial available. For example, Techni S Nickel Sulfamate bath and JB-100 (stress reducer) can be purchased from Technic, Inc.

Figure 9B:
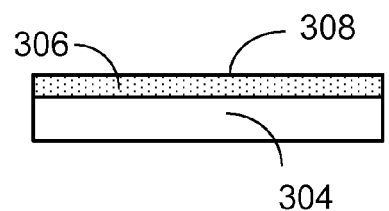

In FIG. 9B, Nickel 302 is planarized to become a desired nickel layer 306 which has a predetermined thickness. In addition, the nickel surface 308 is flat and smooth after planarization.

FIGS. 9C-9G are similar to the FIGS. 6C-6G of the first implementation of the first approach in FIG. 6.

Figure 9C:
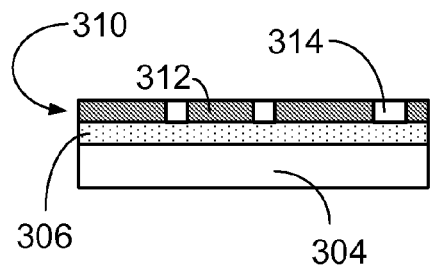

In FIG. 9C, the nickel layer is selectively etched via laser micromachining through a photomask 310 which has light barriers 312 which stop laser light and protect the underneath nickel and light apertures 314 through which laser light can etch the underneath nickel.

Figure 9D:
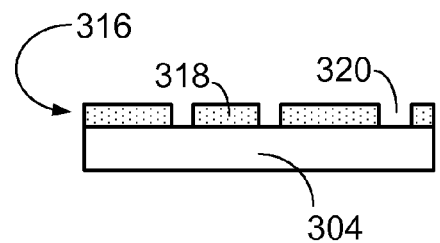

FIG. 9D shows the etching result after the photomask 310 has been removed, where a patterned nickel layer 316 has nickel features 318 and openings 320.

Figure 9E:
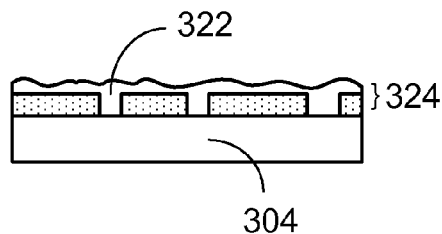

In FIG. 9E, a second material 322, gold, is blanket deposited over the exposed copper and the nickel. Gold deposition can be operated in a gold plating tank via electrodeposition. A suitable gold plating bath may be selected from either gold cyanide baths or non-cyanide baths. For example, a suitable non-cyanide bath is Techni Gold 25 from Technic, Inc. Before gold plating, the exposed copper and the nickel may be cleaned and activated using such as chemical cleaning or ultrasonic cleaning followed by acid activation (e.g., 5% (volume) sulfuric acid solution). Ensure that even the lowest points of the gold 322 reach a predetermined thickness for gold deposition.

Figure 9F:
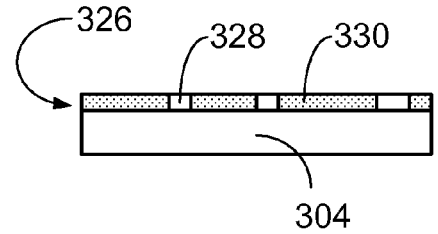

The two-material layer 324 shown in FIG. 9E is planarized (e.g., diamond lapping or the like) to form a desired two-material layer 326 shown in FIG. 9F. After planarization, both gold features 328 and the nickel features 330 are exposed and at the same level. The top surface of the layer 326 reaches a predetermined flatness and smoothness. The layer 326 also reaches a predetermined thickness.

Optionally, the above steps (selective etching, blanket deposition and planarization from FIG. 9C to FIG. 9F) may be repeated a plurality of times to form a multi-material layer.

Further optionally, the whole above steps (blanket deposition, planarization, selective etching, blanket deposition and planarization from FIG. 9A to FIG. 9F) may be repeated a plurality of times to form a group of multi-material layers. Note that in this case for FIG. 9A a given layer is deposited on the finished previous layer. For example, a second layer is deposited on the finished first layer which is on the substrate.

Figure 9G:
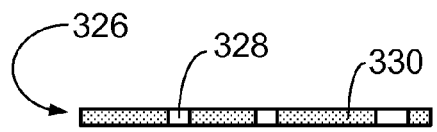

To separate the desired two-material layer 326 from the copper substrate 304 shown in FIG. 9F, the copper substrate 304 may be dissolved in a copper etchant. For example, Enstrip® C-38 manufactured by Enthone Inc. is a very effective copper etchant which is compatible with nickel and gold. FIG. 9G shows the free-standing layer 326. If the layer 326 curls due to stress effect after separation, a mechanical approach may be used to flatten the layer 326, e.g., using a rolling machine, a pressing machine, or the like.

The above steps may be repeated to build all the required individual single two-material layers and/or individual groups of two-material layers which, after stacking, aligning and attaching together, compose a multi-layer structure.

Finally, the nickel is selectively etched away by using a nickel etchant to release a desired three-dimensional gold structure. There are many commercial nickel etchants. For example, we can use Nickel Stripper M-7 manufactured by Atotech Inc. to etch away nickel. The etchant is compatible with gold. Alternatively, we can also use a nitric acid solution, by mixing one part (volume) concentrated nitric acid with one part (volume) water together, to dissolve nickel. The nitric acid solution is also compatible with gold.

Figure 10:
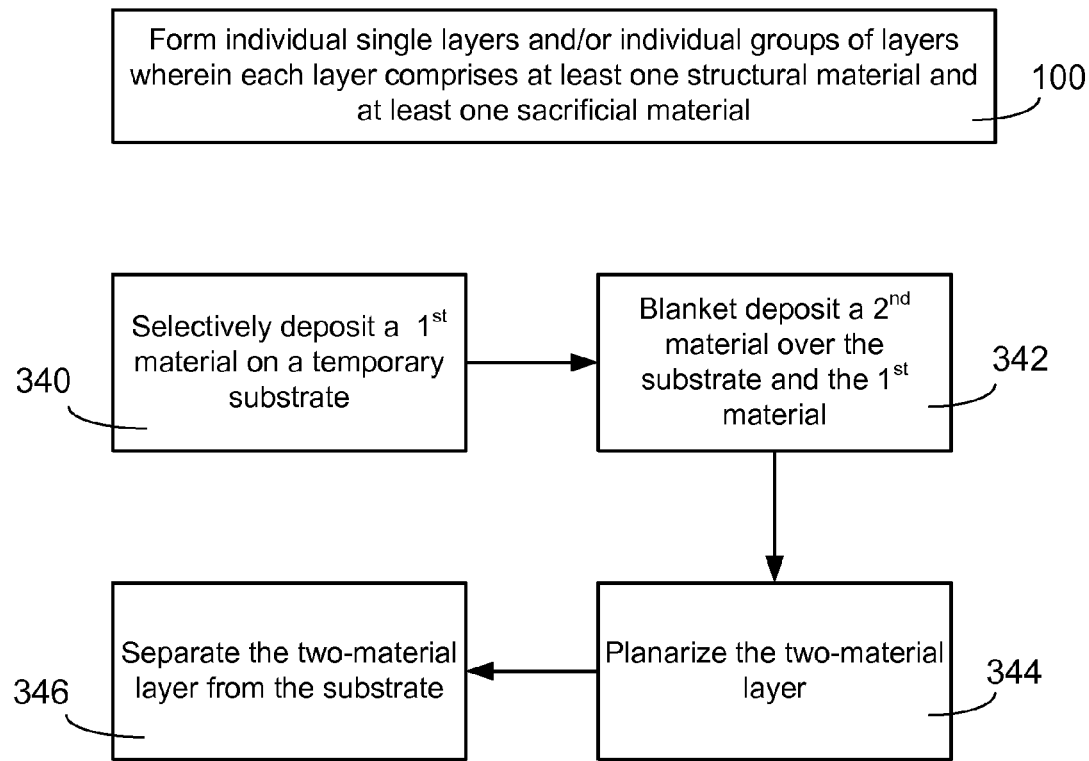
FIG. 10 provides a block diagram indicating a third approach for building individual multi-material single layers and individual groups of multi-material layers.

FIG. 10 provides a block diagram indicating a third approach for building individual multi-material single layers and individual groups of multi-material layers by first selectively depositing a layer of a first material. The first block 100 sets forth the goal of this approach. The primary steps of this approach for forming a single two-material layer are shown from block 340 to block 346.

Block 340 sets forth a first step of the approach which involves selectively depositing a layer of a first material onto a temporary substrate by various selective deposition methods. For example, a layer of a mask material such as a photoresist can be patterned on the substrate. Then electrodeposition can be operated to fill a first material into the openings in the mask layer. Or the instant-mask plating technique (disclosed in U.S. Pat. No. 6,027,630, issued on Feb. 22, 2000 to Adam Cohen) can be used to directly produce a pattern layer of a first material.

Block 342 sets forth a second step of the approach which involves blanket depositing a second material over the exposed substrate and the first material by various deposition methods. For example, electrochemical deposition such as electroplating or electroless plating may be used to produce metals, alloys, oxides, conductive polymers, or composites. Physical deposition such as vacuum deposition (PVD, CVD, sputtering, or the like) can deposit semiconductor materials, metals and alloys. Physical deposition such as thermal and cold spray can deposit metals, alloys and ceramics. Liquid polymers may be sprayed or spread and then be solidified by use of heat, radiation or the like. Those of skill in the art will understand that there are also other deposition methods suitable for this purpose.

Block 344 sets forth a third step of the approach which involves planarizing the two-material layer via diamond lapping, diamond polishing, CMP, milling, grinding, or the like.

Block 346 sets forth a fourth step of the approach which involves separating the two-material layer from the temporary substrate. This operation may be done by peeling the layer away from the substrate, machining the substrate, dissolving the substrate, dissolving a releasing layer, and combinations thereof.

Like the first and second approach, to make a group of two-material layers, the operation steps (the steps 1, 2 and 3) discussed above may be repeated a plurality of times before the operation of the fourth step. Note that in this case for the step 1 a given layer is selectively deposited on the finished previous layer which is on the substrate. For example, a second layer is selectively deposited on the finished first layer which is on the substrate. The fourth step is then operated to separate the group of two-material layers from the substrate.

To make a multi-material layer or a group of multi-material layers, the operations of the third, the fourth and the fifth steps in the first and second approach (FIG. 5 and FIG. 8) may be used here, which are repeated a plurality of times to fill different materials into the openings generated in the layer before the operation of the fourth step of the third approach. The fourth step of the third approach is then operated to separate the multi-material layer from the substrate. This strategy can also be used to form groups of multi-material layers.

Lastly, if a single multi-material layer or a group of multi-material layers is curved after separation due to, e.g., the effect of stress. A proper flattening process via pressing, rolling, heating, or combination thereof may be used to obtain a flat product.

A specific implementation will be discussed to teach working principles of the third approach of the invention for forming single multi-material layers or groups of multi-material layers, but are not intended to limit the scope of the invention to the implementation presented. Rather, the scope of the invention is intended to be set by the claims interpreted in view of the specification.

FIGS. 11A-11F provide schematic illustrations of side views at various process stages of an implementation of the third approach for building a single layer comprising two materials, gold and nickel.

Figure 11A:
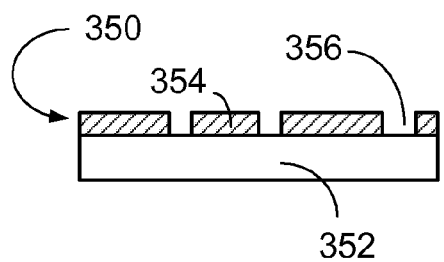
FIGS. 11A-11F provide schematic illustrations of side views at various process stages of an implementation of the third approach for building a single layer comprising two materials, gold and nickel.

In FIG. 11A, a photoresist such as AZ4620 is applied on a copper substrate 352 and UV-exposed through a photomask (not shown) to form a pattern layer of photoresist 350 which contains photoresist features 354 and openings 356. This can be done with a standard cleanroom photolithography process. The copper substrate has a flat, smooth and clean surface suitable for the application of the photoresist on it.

Figure 11B:
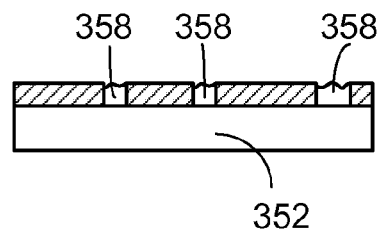

In FIG. 11B, a first material 358, nickel, is deposited into the openings 356. A suitable nickel plating bath is a nickel sulfamate plating bath although other nickel plating baths can also be used. The internal stress of the nickel 358 may be controlled to be near zero by adding a suitable stress reducer in the nickel sulfamate bath. Suitable nickel sulfamate plating baths and stress reducers are commercial available. For example, Techni S Nickel Sulfamate bath and JB-100 (stress reducer) can be purchased from Technic, Inc. Ensure that even the lowest points of the nickel 358 reach a predetermined thickness.

Figure 11C:
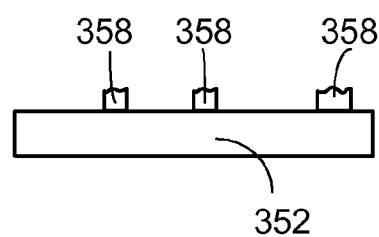

After nickel plating, the photoresist layer 350 is stripped with a photoresist stripper. A nickel pattern consisting of the nickel features 358 is shown in FIG. 11C.

Figure 11D:
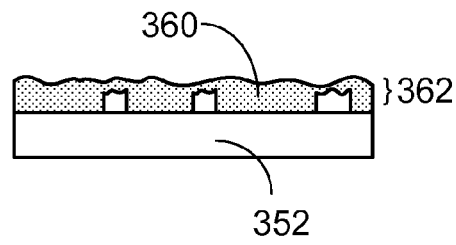

In FIG. 11D, a second material 360, gold, is blanket deposited over the exposed copper and the nickel. Gold deposition can be operated in a gold plating tank via electrodeposition. A suitable gold plating bath may be selected from either gold cyanide baths or non-cyanide baths. For example, a suitable non-cyanide bath is Techni Gold 25 from Technic, Inc. Before gold plating, the exposed copper and the nickel may be cleaned and activated using such as chemical cleaning or ultrasonic cleaning followed by acid activation (e.g., 5% (volume) sulfuric acid solution). Ensure that even the lowest points of the gold 360 reach a predetermined thickness for gold deposition.

Figure 11E:
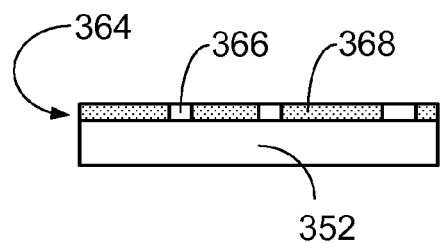

The two-material layer 362 shown in FIG. 11D is planarized (e.g., diamond lapping or the like) to form a desired two-material layer 364 shown in FIG. 11E. After planarization, both gold features 368 and the nickel features 366 are exposed and at the same level. The top surface of the layer 364 reaches a predetermined flatness and smoothness. The layer 364 also reaches a predetermined thickness.

Figure 11F:
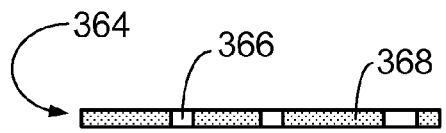

To separate the desired two-material layer 364 from the copper substrate 352 shown in FIG. 11E, the copper substrate 352 may be dissolved in a copper etchant. For example, Enstrip® C-38 manufactured by Enthone Inc. is a very effective copper etchant which is compatible with nickel and gold. FIG. 11F shows the free-standing layer 364. If the layer 364 curls due to stress effect after separation, a mechanical approach may be used to flatten the layer 364, e.g., using a rolling machine, a pressing machine, or the like.

The above steps may be repeated to build all the required individual single two-material layers and/or individual groups of two-material layers which, after stacking, aligning and attaching together, compose a multi-layer structure.

Finally, the nickel is selectively etched away by using a nickel etchant to release a desired three-dimensional gold structure. There are many commercial nickel etchants. For example, we can use Nickel Stripper M-7 (Atotech Inc.) to etch away nickel. The etchant is compatible with gold. Alternatively, we can also use a nitric acid solution, by mixing one part (volume) concentrated nitric acid with one part (volume) water together, to dissolve nickel. The nitric acid solution is also compatible with gold.

Although the any one of the above three approaches alone can be used to build groups of layers, each of which has at least two materials, those skill in the art will understand that a group of layers may be fabricated by using only one of the approaches, or by the combinations of the approaches. The three approaches may also be used together via various combinations to produce groups of multi-material layers.

The first embodiment (FIG. 1) of the present invention is a parallel process, meaning that the layers and/or the groups of layers for constructing a three-dimensional structure can be made separately and all the layers can then be attached together simultaneously. In contrast with the existing successive multi-layer fabrication methods, this invention can greatly increase production speed. In the present invention, as we now only need to produce individual single layers and/or individual groups of layers (usually several layers), the fabrication processes can be much more easily controlled. Moreover, with this invention, we can mass produce the copies of the layers. Only quality-approved layers will be used for final attaching. Thus the production yield can also be greatly improved.

In contrast with the multi-layer electrochemical fabrication methods, this invention can use bulk materials as structural material. Although a small portion of bulk materials can be electrochemically deposited practically and cost-effectively, in some cases, it may prefer to use bulk materials as their material properties are more desired than the ones of their corresponding materials made with electrochemical deposition. With using bulk materials, lots of new material structures can be made. We now can build three-dimensional structures of stainless steel, titanium and its alloys, silicon and even non-metal materials, which are impossible to be made by using the known three-dimensional electrochemical fabrication techniques. New applications can be found in microsensors, micro-medical devices, lab-on-chip devices, micro-electronic devices, MEMS devices, to just name few. In addition, with using bulk materials, layer thickness will not be an issue as commercial bulk materials with various thicknesses can be selected to meet different thickness requirements for the fabrication of three-dimensional structures. Alternatively, we can also machine bulk materials to obtain required thicknesses.

Still in contrast with the multi-layer electrochemical fabrication methods, this invention can produce three-dimensional structures containing sealed cavities. So this invention can truly make virtually any complex arbitrary three-dimensional structures.

Figure 12:
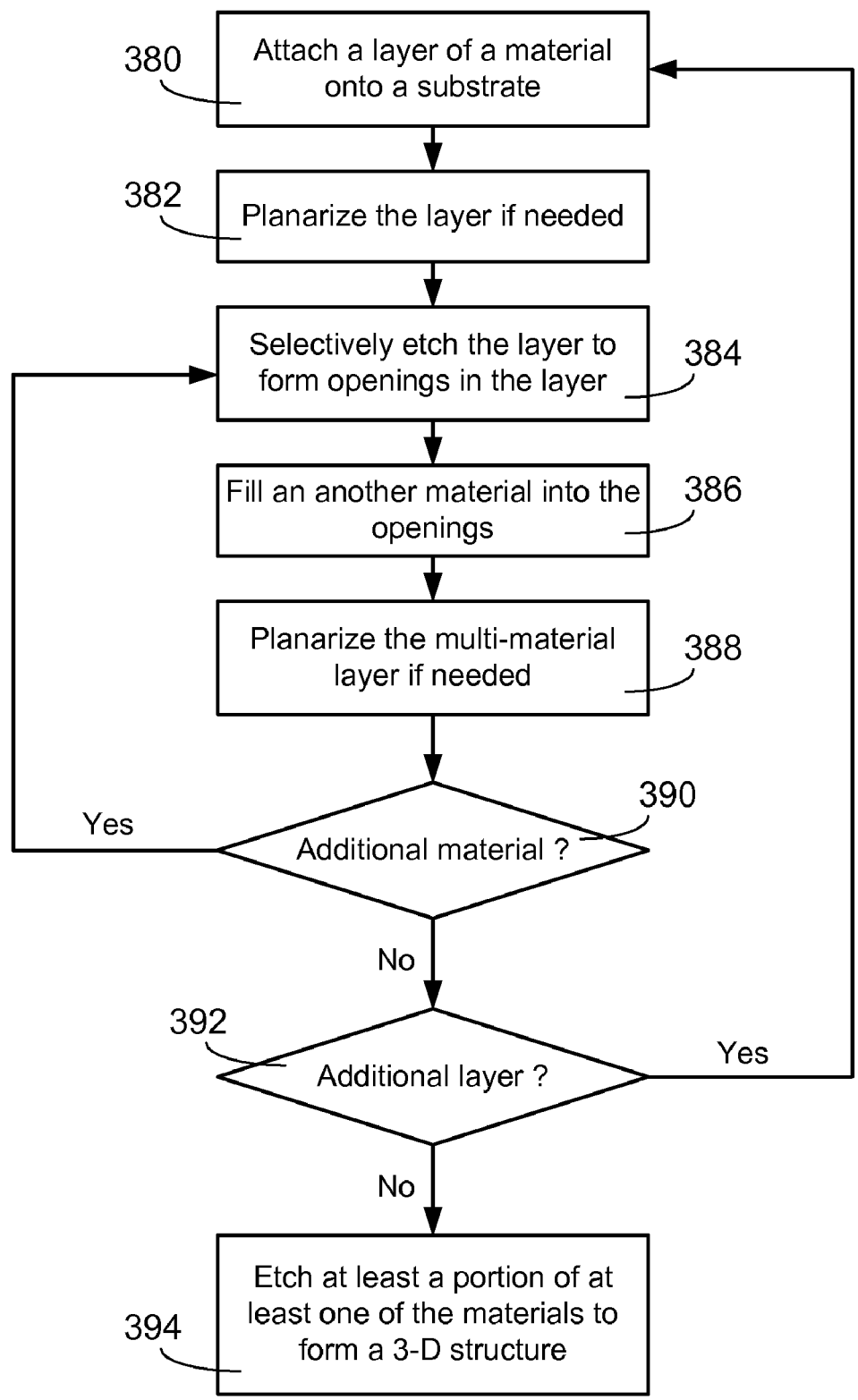
FIG. 12 provides a block diagram indicating the primary process steps of a second embodiment of the present invention for forming a three-dimensional structure via successively attaching and fabricating a plurality of layers.

FIG. 12 provides a block diagram indicating the primary process steps of a second embodiment of the present invention for forming a three-dimensional structure via successively attaching and fabricating a plurality of layers.

Blocks 380-388 are similar to the blocks 200-208 in FIG. 5.

Block 380 sets forth a first step of the process of the second embodiment of the present invention, which involves attaching a layer of a material onto a substrate by using methods such as diffusion bonding or the like. The substrate in the Block 380 refers to either an initial substrate or the combination of the previously formed layer(s) and the initial substrate.

Block 382 sets forth a second step (optional) of the process which involves planarizing the attached layer. This step needs to be applied if (1) the layer needs to be machined down to a predetermined thickness, (2) the layer needs to have a uniform thickness, and/or (3) the layer top surface needs to achieve flatness and smoothness for the following processing steps. Many machining techniques may be used for this purpose, e.g., diamond lapping, diamond turning, chemical-mechanical polishing, milling, grinding or the like.

Block 384 sets forth a third step of the process which involves selectively etching the attached layer to form openings in the layer. Selective etching may be operated by using laser micromachining through a pattern mask. Selective etching may be operated by using chemical etching, electrochemical etching or deep reactive ion etching if the layer material is silicon to the layer on which a mask material (e.g., a photoresist) is patterned so that the material to be etched is exposed. Selective etching may also be operated by using ultrasonic machining or electrical discharge machining. Those of skill in the art will understand that there are other selective etching methods.

Block 386 sets forth a fourth step of the process which involves filling an another material into the openings in the layer. There are many filling methods available for handling various materials. For example, electrochemical deposition such as electroplating or electroless plating may be used to fill into the openings with a metal, alloy, oxide, conductive polymer, or composite. Physical deposition such as vacuum deposition (PVD, CVD, sputtering, etc.) can deposit semiconductor materials, metals and alloys. Physical deposition such as thermal and cold spray can deposit metals, alloys and ceramics. Liquid polymers may be sprayed or spread into the openings and then be solidified by use of heat, radiation or the like. Those of skill in the art will understand that there are also other deposition methods suitable for this purpose.

Block 388 sets forth a fifth step of the process which involves planarizing the two-material layer. This step needs to be operated if the following requirements should be met.

(1) The two-material layer needs to be machined to a predetermined thickness;

(2) Both materials need to be exposed and both material surfaces need to be flush; and/or (3) The two-material layer surface needs to achieve a predetermined flatness and smoothness.

Again, many machining techniques may be used for this purpose, e.g., diamond lapping, diamond turning, chemical-mechanical polishing, milling, grinding or the like.

Block 390 is a decision point where the next process direction will be determined by answering the question in the block. If an additional material is needed to be added into the layer, then the steps 3-5 will be repeated. If no additional material is needed, the process moves forward to block 392.

Block 392 is another decision point where the next process direction will be determined by answering the question in the block. If an additional layer is needed, then the steps 1-5 will be repeated. If no additional layer is needed, move forward to block 394.

Block 394 sets forth a sixth step of the process which involves etching at least a portion of at least one of the materials to form a three-dimensional structure via chemical etching, electrochemical etching, or the like.

A specific implementation will be discussed to teach working principles of the second embodiment of the invention for forming a three-dimensional structure, but are not intended to limit the scope of the invention to the implementation presented. Rather, the scope of the invention is intended to be set by the claims interpreted in view of the specification.

FIGS. 13A-13H provide schematic illustrations of side views at various process stages of an implementation of the second embodiment of the invention for building a three-dimensional stainless steel structure.

Figure 13A:
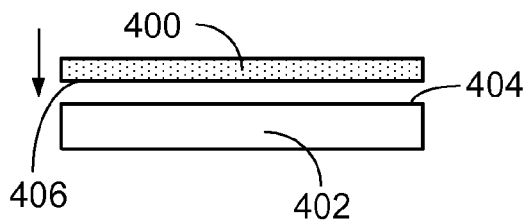
FIGS. 13A-13H provide schematic illustrations of side views at various process stages of an implementation of the second embodiment of the invention for building a three-dimensional stainless steel structure.

In FIG. 13A, a 316L stainless steel foil 400 with proper thickness, flatness and smoothness is attached to a ceramic substrate 402 such as alumina. The substrate 402 has suitable surface flatness and smoothness for the attaching process. Either diamond lapping or the like can be employed to machine the substrate surface 404 to be flat and smooth. High precision stainless steel layers may be used as they not only have smooth and flat surfaces, but also have uniform thicknesses. Alternatively, the both sides of a stainless layer can be planarized by using diamond lapping and polishing or the like so that the both surfaces become flat and smooth and the layer has a uniform thickness. The stainless steel 400 can be attached onto the substrate 402 via, e.g., diffusion bonding with a proper pressure on the two materials and a proper bonding temperature and time in a vacuum chamber. Right before diffusion bonding, the two materials may be pretreated to make two bonding surfaces 404 and 406 clean and active. For example, acetone cleaning followed by acid dipping may be used for this purpose.

Figure 13B:
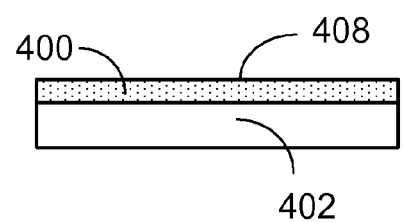

FIG. 13B shows the bonded ceramic substrate 402 and stainless steel layer 400 after diffusion bonding. The top surface 408 of the stainless steel layer 400 may be planarized via diamond lapping and polishing to achieve a desired surface flatness and smoothness, and a desired thickness if needed.

Figure 13C:
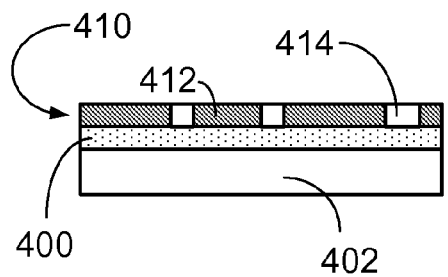

Many methods may be used to selectively etch stainless steel layers to form a desired pattern, e.g., electrochemical photo etching, laser machining or the like. In this implementation, laser micromachining is used to selectively remove part of the stainless steel layer 400 to form a desired pattern. In FIG. 13C, a photomask 410 with a desired pattern is placed over the stainless steel layer 400. The photomask 410 has light barriers 412 which stop laser light and protect the underneath stainless steel and light apertures 414 through which laser light can etch the underneath stainless steel. An excimer laser may be used to etch the stainless steel layer 400 to form the desired pattern (openings) by exposing the stainless steel layer 400 through the photomask 410. The laser machining process needs to be precisely control to just remove all the exposed stainless steel through all the thickness down to the ceramic substrate top surface, but not damage the substrate underneath the removed stainless steel.

Figure 13D:
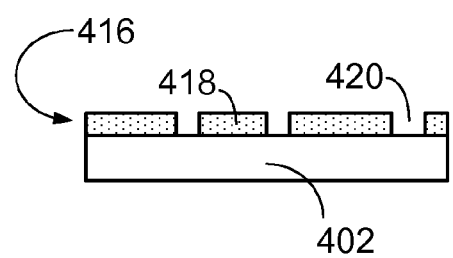

FIG. 13D shows the etching result after the photomask 410 has been removed, where a stainless steel pattern 416 has stainless steel features 418 and openings 420.

Figure 13E:
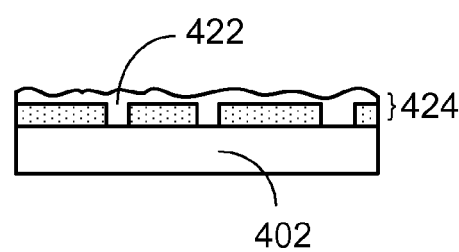

In FIG. 13E, an another material 422, copper, is blanket electrodeposited over the exposed substrate and the stainless steel. Copper deposition can be operated in a copper plating tank via electrodeposition. A suitable copper plating bath may be selected from acid copper baths, pyrophosphate copper baths, cyanide copper baths or other types of baths. For example, Techni FB acid copper bath from Technic, Inc. may be used. Before copper plating, the exposed ceramic surface need to be metallized so that copper can be deposited on the ceramic surface. This can be done by, e.g., sputtering a thin layer of copper or electroless depositing a thin copper on the ceramic surface. Still before copper plating, the metal surfaces may be cleaned and activated using such as chemical cleaning or ultrasonic cleaning followed by acid activation. Ensure that even the lowest points of the copper 422 reach a predetermined thickness for copper deposition.

Figure 13F:
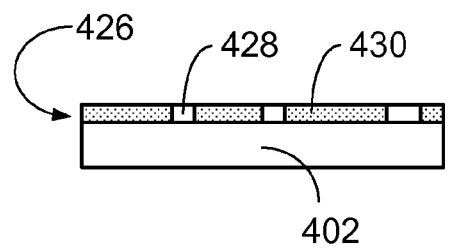

The two-material layer 424 shown in FIG. 13E is planarized (e.g., diamond lapping or the like) to form a desired two-material layer 426 shown in FIG. 13F. After planarization, both stainless features 430 and the copper features 428 are exposed and at the same level. The top surface of the layer 426 reaches a predetermined flatness and smoothness. The layer 426 also reaches a predetermined thickness.

Figure 13G:
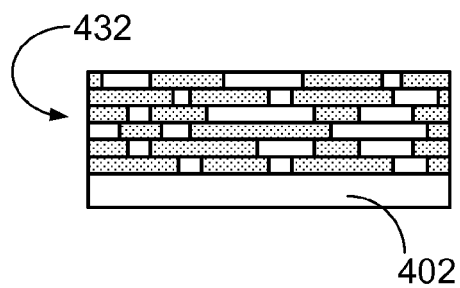

The process steps shown in FIGS. 13A-13F are repeated a plurality of times to form a multi-layer (6-layer in this case) structure 432 shown in FIG. 13G where each layer consists of two materials, copper and stainless steel. Note that in this case for the step in FIG. 13A a given layer is attached on the finished previous layer. For example, a second layer of stainless steel is attached on the finished first layer which is on the substrate.

Figure 13H:
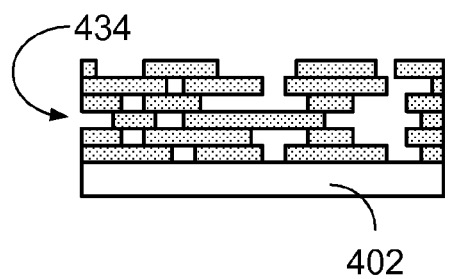

In FIG. 13H, the copper is etched to form a three-dimensional stainless steel structure 434 on the ceramic substrate 402. For example, Enstrip® C-38 manufactured by Enthone Inc. is a very effective copper etchant which is compatible with ceramics and stainless steel.

Although the second embodiment of the present invention is a successive process, meaning that the building sequence is a layer-by-layer style, it solves several major drawbacks of the multi-layer electrochemical fabrication techniques because of using bulk materials instead of using materials electrochemically deposited.

In contrast with the multi-layer electrochemical fabrication methods, the second embodiment of the present invention can use bulk materials as structural material. Although a small portion of bulk materials can be electrochemically deposited practically and cost-effectively, in some cases, it may prefer to use bulk materials as their material properties are more desired than the ones of their corresponding materials made with electrochemical deposition. With using bulk materials, lots of new material structures can be made. We now can build three-dimensional structures of stainless steel, titanium and its alloys, silicon and even non-metal materials, which are impossible to be made by using the known three-dimensional electrochemical fabrication techniques. In addition, with using bulk materials, layer thickness will not be an issue as commercial bulk materials with various thicknesses can be selected to meet different thickness requirement for the fabrication of three-dimensional structures. Alternatively, we can also machine bulk materials to obtain required thicknesses.

Still in contrast with the electrochemical multi-layer fabrication methods, the second embodiment of the present invention uses an attaching process to attach a layer of a material either on a previously built layer or on a substrate. Unlike the electrochemical multi-layer methods which require a continuous surface on a previous layer for building a given layer on it, the second embodiment of the present invention can use either a continuous surface or a discontinuous surface on a previous layer for building a given layer on it. Thus, the second embodiment of the present invention can truly make virtually any complex arbitrary three-dimensional structures, for example, containing sealed cavities.

Although the second embodiment of the present invention can be used to build a complete three-dimensional structure, it can also be integrated into the multi-layer electrochemical methods disclosed in U.S. Pat. No. 5,190,637 and U.S. Pat. No. 6,027,630. In other words, the second embodiment of the present invention can be used only for building a single layer or multi-layers either continuously or discontinuously in a whole build. The rest layers are still built with the either of the two multi-layer electrochemical methods.

It should note that all the features disclosed as well as combinations of the features disclosed are the object of this invention. While the present invention has been described with reference to particular embodiments and implementation thereof, it will be understood that many further embodiments, alternatives, modifications and implementations will be apparent by those skilled in the art without actually departing from the spirit and scope of the invention as defined in the above description. As such, it is not intended that the invention be limited to the particular illustrative embodiments and implementations described above but instead that it be solely limited by the claims presented hereafter.

What is claimed is:

1. A method for fabricating a multi-layer three-dimensional structure, comprising:
   (a) forming a plurality of separate layers, each comprising a plurality of materials comprising at least one structural material and at least one sacrificial material, wherein at least two of said layers are not attached together directly or indirectly;
   (b) aligning said layers in a predetermined arrangement so that said layers are stacked and oriented as desired;
   (c) attaching said layers together to form a multi-layer structure; and
   (d) removing at least a portion of at least one sacrificial material from said multi-layer structure to form a multi-layer three-dimensional structure.

2. The method of claim 1, wherein in the step (a), at least one of said layers comprises at least one opening.

3. The method of claim 1, wherein in the step (a), at least two regions on one side of at least one of said layers are not coplanar.

4. The method of claim 1, wherein in the step (a), said layers comprise at least one separate single layer wherein said at least one single layer is not attached to any other of said layers directly or indirectly.

5. The method of claim 4 wherein the formation of at least one of said at least one single layer comprises:
   (a) providing a substrate;
   (b) attaching a layer of a first material onto said substrate;
   (c) selectively etching or machining said first material to form at least one opening;
   (d) filling at least a second material at least into at least one of said at least one opening to form a multi-material layer; and
   (e) separating said multi-material layer from said substrate wherein said multi-material layer comprises at least one structural material and at least one sacrificial material.

6. The method of claim 5, further comprising:
   (a) planarizing said first material after the step of attaching a layer of a first material and before the step of selectively etching or machining said first material; and/or
   (b) planarizing said multi-material layer after the step of filling at least a second material.

7. The method of claim 5 wherein the step of selectively etching or machining said first material comprises laser machining, electrochemical etching, chemical etching, or deep reactive ion etching.

8. The method of claim 4 wherein the formation of at least one of said at least one single layer comprises:
   (a) providing a substrate;
   (b) forming a layer of a first material onto said substrate;
   (c) selectively etching or machining said first material to form at least one opening;
   (d) filling at least a second material at least into at least one of said at least one opening to form a multi-material layer; and
   (e) separating said multi-material layer from said substrate wherein said multi-material layer comprises at least one structural material and at least one sacrificial material.

9. The method of claim 8 wherein the step of forming a layer of a first material comprises deposition.

10. The method of claim 8, further comprising:
    (a) planarizing said first material after the step of forming a layer of a first material and before the step of selectively etching or machining said first material; and/or
    (b) planarizing said multi-material layer after the step of filling at least a second material.

11. The method of claim 4 wherein the formation of at least one of said at least one single layer comprises:
    (a) providing a substrate;
    (b) selectively forming at least a first material onto at least one region of said substrate;
    (c) forming at least a second material over said at least first material and one or more regions of said substrate that are not covered by said at least first material to form a multi-material layer;
    (d) planarizing said multi-material layer; and
    (e) separating said multi-material layer from said substrate wherein said multi-material layer comprises at least one structural material and at least one sacrificial material.

12. The method of claim 11 wherein the step of selectively forming at least a first material comprises selective deposition and/or wherein the step of forming at least a second material comprises blanket deposition.

13. The method of claim 1, wherein in the step (a), said layers comprise at least one group of layers comprising a plurality of attached single layers wherein said at least one group of layers is not attached to any other of said layers directly or indirectly.

14. The method of claim 1, wherein in the step (c), said layers are attached together in one or more times to form said multi-layer structure.

15. The method of claim 1 wherein the step of attaching said layers together comprises diffusion bonding.

16. The method of claim 1 wherein each of said layers comprises silicon or consists essentially of silicon and wherein the step of attaching said layers together comprises silicon direct bonding.

17. The method of claim 1 wherein the step of removing at least a portion of at least one sacrificial material comprises chemical etching or electrochemical etching.

18. The method of claim 17 wherein said chemical etching or said electrochemical etching is operated in an etching solution wherein said etching solution comprises at least one composition for the protection of at least one structural material of said multi-layer structure from damage during the etching operation wherein said at least one composition comprises at least one corrosion inhibitor.

19. The method of claim 1, further comprising:
    (a) providing a substrate and attaching said multi-layer structure to said substrate in a predetermined arrangement prior to the step of removing at least a portion of at least one sacrificial material; or
    (b) providing a substrate and attaching said three-dimensional structure to said substrate in a predetermined arrangement after the step of removing at least a portion of at least one sacrificial material.

20. The method of claim 1, further comprising:
    post-surface treating said three-dimensional structure by forming at least one coating on at least a portion of said three-dimensional structure after the step of removing at least a portion of at least one sacrificial material.

21. The method of claim 20 wherein at least one material of said three-dimensional structure comprises copper or copper alloy and wherein the step of post-surface treating said three-dimensional structure comprises:
    immersing said three-dimensional structure in a solution comprising at least one copper corrosion inhibitor to form a film on at least said copper or said copper alloy.

22. The method of claim 21 wherein said at least one copper corrosion inhibitor comprises at least benzotriazole.

23. A method for fabricating a multi-layer three-dimensional structure, comprising:
- (a) forming a plurality of separate layers, each comprising a plurality of materials comprising at least one structural material and at least one sacrificial material, wherein at least two of said layers are not attached together directly or indirectly;
- (b) providing a substrate;
- (c) aligning said layers and said substrate in a predetermined arrangement so that said layers or said layers and said substrate are stacked and oriented as desired;
- (d) attaching said layers and said substrate to form a multi-layer structure; and
- (e) removing at least a portion of at least one sacrificial material from said multi-layer structure to form a multi-layer three-dimensional structure.

24. A method for fabricating a multi-layer three-dimensional structure, comprising:
- (a) attaching a layer of a material onto a substrate or onto a previously formed layer;
- (b) selectively etching or machining said material to form at least one opening;
- (c) filling at least an additional material at least into at least one of said at least one opening to form a multi-material layer comprising said material and said at least an additional material;
- (d) repeating the above steps from (a) to (c) one or more times to form a multi-layer structure comprising a plurality of attached layers; and
- (e) removing at least a portion of at least one material from said multi-layer structure to form a multi-layer three-dimensional structure.

25. The method of claim 24 wherein the formation of at least one layer of said attached layers further comprises:
- (a) planarizing said material after the step of attaching a layer of a material and before the step of selectively etching or machining; and/or
- (b) planarizing said formed multi-material layer after the step of filling at least an additional material and before the step of repeating the above steps.

26. The method of claim 24 wherein the step of attaching a layer of a material comprises diffusion bonding.

27. The method of claim 24 wherein each of said attached layers comprises silicon or consists essentially of silicon and wherein the step of attaching a layer of a material comprises silicon direct bonding.

28. The method of claim 24, further comprising:
post-surface treating said multi-layer three-dimensional structure by forming at least one coating on at least a portion of said multi-layer three-dimensional structure after the step of removing at least a portion of at least one material.

* * * * *